US012767854B2

(12) United States Patent
Kamimura

(10) Patent No.: US 12,767,854 B2
(45) Date of Patent: Oct. 20, 2026

(54) POLISHING LIQUID AND CHEMICAL MECHANICAL POLISHING METHOD

(71) Applicant: FUJIFILM Corporation, Tokyo (JP)

(72) Inventor: Tetsuya Kamimura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 737 days.

(21) Appl. No.: 17/547,180

(22) Filed: Dec. 9, 2021

(65) Prior Publication Data

US 2022/0098444 A1 Mar. 31, 2022

Related U.S. Application Data

(63) Continuation of application No. PCT/JP2020/020087, filed on May 21, 2020.

(30) Foreign Application Priority Data

Jun. 20, 2019 (JP) ................................ 2019-114648

(51) Int. Cl.
*C09G 1/02* (2006.01)
*H10P 14/692* (2026.01)
(Continued)

(52) U.S. Cl.
CPC ............ *C09G 1/02* (2013.01); *H10P 14/6938* (2026.01); *H10P 52/00* (2026.01); *H10P 52/403* (2026.01); *B82Y 40/00* (2013.01)

(58) Field of Classification Search
CPC ...... C09G 1/00–18; H01L 21/461–465; H01L 21/302–3046;
(Continued)

(56) References Cited

U.S. PATENT DOCUMENTS

| | | | |
|---|---|---|---|
| 9,528,030 | B1 | 12/2016 | Kraft et al. |
| 10,283,373 | B2 | 5/2019 | Sakashita et al. |

(Continued)

FOREIGN PATENT DOCUMENTS

| | | |
|---|---|---|
| JP | 2011091248 | 5/2011 |
| JP | 2014229827 | 12/2014 |

(Continued)

OTHER PUBLICATIONS

PubChem—Acrylic Acid (Year: 2024).*

(Continued)

*Primary Examiner* — Duy Vu N Deo
*Assistant Examiner* — Andrew Keelan Laobak
(74) *Attorney, Agent, or Firm* — JCIPRNET

(57) ABSTRACT

The present invention provides a polishing liquid which has a good polishing speed and can suppress the occurrence of corrosion and scratches on a surface to be polished in a case of being applied to CMP of an object to be polished having a cobalt-containing film. The present invention also provides a chemical mechanical polishing method using the polishing liquid. The polishing liquid of an embodiment of the present invention is a polishing liquid used for chemical mechanical polishing of an object to be polished having a cobalt-containing film, the polishing liquid including colloidal silica, a passivation film forming agent having a C log P value of 1.5 to 3.8, a polymer compound, and hydrogen peroxide, in which a pH is 2.0 to 4.0.

20 Claims, 2 Drawing Sheets

(51) Int. Cl.
*H10P 52/00* (2026.01)
*H10P 52/40* (2026.01)
*B82Y 40/00* (2011.01)

(58) Field of Classification Search
CPC .......................... H01L 21/02052–02057; H01L 21/30612–30625; H01L 21/30604–30608; H01L 2224/03616; H01L 2224/03845; H01L 2224/11616; H01L 2224/11845; H01L 2224/27616; H01L 2224/27845; H01L 2224/30625; H01L 21/00–86; H01L 2224/00–95148; C09K 3/00–32; C11D 2111/00–48; C23F 1/00–46
See application file for complete search history.

(56) References Cited

U.S. PATENT DOCUMENTS

| | | | | |
|---|---|---|---|---|
| 2017/0154787 | A1 | 6/2017 | Sakashita et al. | |
| 2017/0200601 | A1* | 7/2017 | Song | C11D 7/08 |
| 2018/0226267 | A1* | 8/2018 | Hayama | H10P 52/403 |
| 2019/0080927 | A1* | 3/2019 | Izawa | C09G 1/02 |

FOREIGN PATENT DOCUMENTS

| | | | | | |
|---|---|---|---|---|---|
| JP | 2017048256 | | | 3/2017 | |
| JP | 2017048256 | A | * | 3/2017 | C09G 1/00 |
| JP | 2017107918 | | | 6/2017 | |
| JP | 2017157591 | | | 9/2017 | |
| JP | 2019501511 | | | 1/2019 | |
| KR | 20170028889 | | | 3/2017 | |
| KR | 20170037693 | A | * | 4/2017 | B24B 37/02 |
| KR | 20190005918 | A | * | 1/2019 | H10P 52/00 |
| TW | 201531540 | | | 8/2015 | |
| TW | 201631108 | | | 9/2016 | |
| TW | 201835287 | | | 10/2018 | |
| WO | WO-2015005200 | A1 | * | 1/2015 | C09G 1/04 |
| WO | 2016006631 | | | 1/2016 | |
| WO | WO-2016181888 | A1 | * | 11/2016 | B24B 37/00 |
| WO | 2018159530 | | | 9/2018 | |
| WO | WO-2018168534 | A1 | * | 9/2018 | H01L 21/31053 |
| WO | WO-2019035161 | A1 | * | 2/2019 | C09G 1/02 |

OTHER PUBLICATIONS

PubChem—Methacrylic Acid (Year: 2024).*
PubChem—Salicylic Acid (Year: 2024).*
William C. Griffin, “Calculation of HLB Values of Non-Ionic Surfactants”, 1954, Journal of the Society of Cosmetic Chemists, p. 254 (Year: 1954).*
NIST Chemistry WebBook—2-Naphthalenecarboxylic acid, 3-hydroxy- (Year: 2024).*
“International Search Report (Form PCT/ISA/210) of PCT/JP2020/020087,” mailed on Aug. 11, 2020, with English translation thereof, pp. 1-7.
“Written Opinion of the International Searching Authority (Form PCT/ISA/237)” of PCT/JP2020/020087, mailed on Aug. 11, 2020, with English translation thereof, pp. 1-10.
“Office Action of Korea Counterpart Application”, issued on Feb. 13, 2024, with English translation thereof, p. 1-p. 10.
Office Action of Taiwan Counterpart Application, with English translation thereof, issued on Sep. 21, 2023, pp. 1-18.
“Notice of Final Rejection of Korea Counterpart Application”, issued on Oct. 8, 2024, with English translation thereof, p. 1-p. 8.

* cited by examiner

POLISHING LIQUID AND CHEMICAL MECHANICAL POLISHING METHOD

CROSS-REFERENCE TO RELATED APPLICATIONS

This application is a Continuation of PCT International Application No. PCT/JP2020/020087 filed on May 21, 2020, which claims priority under 35 U.S.C. § 119(a) to Japanese Patent Application No. 2019-114648 filed on Jun. 20, 2019. The above application is hereby expressly incorporated by reference, in its entirety, into the present application.

BACKGROUND OF THE INVENTION

1. Field of the Invention

The present invention relates to a polishing liquid and a chemical mechanical polishing method.

2. Description of the Related Art

In the manufacture of a semiconductor integrated circuit (large-scale integrated circuit: LSI), a chemical mechanical polishing (CMP) method is used for flattening a bare wafer, flattening an interlayer insulating film, forming a metal plug, forming an embedded wiring line, and the like.

For example, JP2014-229827A discloses an aqueous dispersion for chemical mechanical polishing, which includes "(A) abrasive grains, (B) an organic acid having 4 or more carbon atoms, which has π electrons and one or more carboxyl groups, and has two or more of at least one kind of groups selected from the group consisting of a carboxyl group and a hydroxyl group, (C) an amino acid, (D) an anionic surfactant, and (E) an oxidizing agent, and has a pH of 6.5 or more and 9.5 or less".

SUMMARY OF THE INVENTION

By the way, cobalt has recently been attracting attention as a wiring line metal element instead of copper due to a demand for miniaturization of a wiring line.

It is required that a polishing speed with respect to a cobalt-containing film should be at a certain level or higher in performing CMP of an object to be polished having a cobalt-containing film. In addition, it is required that the occurrence of corrosion (surface roughness due to corrosion) and scratch (scratch-like defects) on a surface to be polished of an object to be polished after polishing can be suppressed.

Therefore, an object of the present invention is to provide a polishing liquid which has a good polishing speed and can suppress the occurrence of corrosion and scratches on a surface to be polished in a case of being applied to CMP of an object to be polished having a cobalt-containing film.

In addition, another object of the present invention is to provide a chemical mechanical polishing method using the polishing liquid.

The present inventors have found that the objects can be accomplished by the following configurations.

[1] A polishing liquid used for chemical mechanical polishing of an object to be polished having a cobalt-containing film, the polishing liquid comprising:

colloidal silica;

a passivation film forming agent having a C log P value of 1.5 to 3.8;

a polymer compound; and hydrogen peroxide, in which a pH is 2.0 to 4.0.

[2] The polishing liquid as described in [1], further comprising a cationic compound.

[3] The polishing liquid polishing liquid as described in [2], in which the cationic compound is a compound including a cation selected from the group consisting of a quaternary ammonium cation and a quaternary phosphonium cation.

[4] The polishing liquid as described in any one of [1] to [3], further comprising a benzotriazole compound.

[5] The polishing liquid as described in [4], in which the polishing liquid includes two or more of the benzotriazole compounds.

[6] The polishing liquid as described in [4] or [5], in which a mass ratio of a content of the passivation film forming agent to a content of the benzotriazole compound is 0.01 to 4.0.

[7] The polishing liquid as described in any one of [1] to [6], in which a zeta potential of the colloidal silica as measured in a state where the colloidal silica are present in the polishing liquid is +20.0 mV or more.

[8] The polishing liquid as described in any one of [1] to [7], in which a content of the colloidal silica is 1.0% by mass or more with respect to a total mass of the polishing liquid, and the colloidal silica has an average primary particle diameter of 5 nm or more.

[9] The polishing liquid as described in any one of [1] to [8], further comprising one or more organic acids selected from the group consisting of polycarboxylic acid and polyphosphonic acid.

[10] The polishing liquid as described in [9], in which the organic acid is one or more selected from the group consisting of citric acid, succinic acid, malic acid, maleic acid, 1-hydroxyethane-1,1-diphosphonic acid, and ethylenediaminetetramethylenephosphonic acid.

[11] The polishing liquid as described in any one of [1] to [10], in which the polymer compound has a carboxylic acid group.

[12] The polishing liquid as described in any one of [1] to [11], in which the polymer compound has a weight-average molecular weight of 2,000 to 30,000.

[13] The polishing liquid as described in any one of [1] to [12], further comprising an organic solvent in an amount of 0.05% to 5.0% by mass with respect to a total mass of the polishing liquid.

[14] The polishing liquid as described in any one of [1] to [13], in which the passivation film forming agent is one or more selected from the group consisting of salicylic acid, 4-methylsalicylic acid, 4-methylbenzoic acid, 4-tert-butylbenzoic acid, 4-propylbenzoic acid, 6-hydroxy-2-naphthalenecarboxylic acid, 1-hydroxy-2-naphthalenecarboxylic acid, 3-hydroxy-2-naphthalenecarboxylic acid, quinaldic acid, 8-hydroxyquinoline, and 2-methyl-8-hydroxyquinoline.

[15] The polishing liquid as described in any one of [1] to [14], in which the C log P value of the passivation film forming agent is 2.1 to 3.8.

[16] The polishing liquid as described in any one of [1] to [15], further comprising an anionic surfactant.

[17] The polishing liquid as described in any one of [1] to [16], further comprising a nonionic surfactant.

[18] The polishing liquid as described in [17], in which an HLB value of the nonionic surfactant is 8 to 15.

[19] The polishing liquid as described in any one of [1] to [18], in which a mass ratio of a content of the passivation film forming agent to a content of the polymer compound is 0.05 or more and less than 10.

[20] The polishing liquid as described in any one of [1] to [19], in which a concentration of solid contents is 10% by mass or more, and the polishing liquid is used after 3-times or more dilution on a mass basis.

[21] A chemical mechanical polishing method comprising a step of obtaining an object to be polished, which has been polished, by bringing a surface to be polished of the object to be polished into contact with a polishing pad attached to a polishing platen while supplying the polishing liquid as described in any one of [1] to [19] to the polishing pad, and relatively moving the object to be polished and the polishing pad to polish the surface to be polished.

[22] The chemical mechanical polishing method as described in [21], in which the method is performed to form a wiring line consisting of a cobalt-containing film.

[23] The chemical mechanical polishing method as described in [21] or [22], in which the object to be polished has a second layer consisting of a material different from that of the cobalt-containing film, and a ratio of a polishing speed of the cobalt-containing film to a polishing speed of the second layer is more than 0.05 and less than 5.

[24] The chemical mechanical polishing method as described in [23], in which the second layer includes one or more materials selected from the group consisting of Ta, TaN, TiN, SiN, tetraethoxysilane, SiC, and SiOC.

[25] The chemical mechanical polishing method as described in any one of [21] to [24], in which a polishing pressure is 0.5 to 3.0 psi.

[26] The chemical mechanical polishing method as described in any one of [21] to [25], in which a supply rate of the polishing liquid supplied to the polishing pad is 0.14 to 0.35 $ml/(min \cdot cm^2)$.

[27] The chemical mechanical polishing method as described in any one of [21] to [26], further comprising a step of cleaning the object to be polished, which has been polished, with an alkaline cleaning liquid after the step of obtaining the object to be polished, which has been polished.

[28] The chemical mechanical polishing method as described in any one of [21] to [27], further comprising a step of cleaning the object to be polished, which has been polished, with an organic solvent-based solution after the step of obtaining the object to be polished, which has been polished.

[29] A polishing liquid used for chemical mechanical polishing of an object to be polished, the polishing liquid comprising:

abrasive grains;

a passivation film forming agent having a C log P value of 1.5 to 3.8;

a polymer compound; and hydrogen peroxide, in which a pH is 2.0 to 4.0.

According to the present invention, it is possible to provide a polishing liquid which has a good polishing speed and can suppress the occurrence of corrosion and scratches on a surface to be polished in a case of being applied to CMP of an object to be polished having a cobalt-containing film.

In addition, it is also possible to provide a chemical mechanical polishing method using the polishing liquid.

DESCRIPTION OF THE PREFERRED EMBODIMENTS

Figure 1:
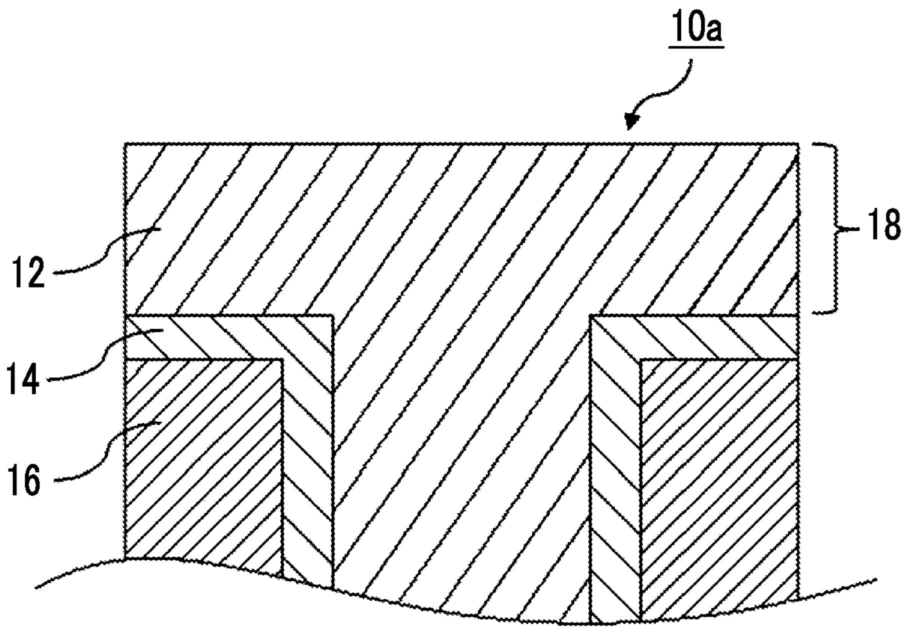
FIG. 1 is a schematic view of an upper part of a cross-section showing an example of an object to be pretreated, which is subjected to a pretreatment for obtaining an object to be polished for which a chemical mechanical polishing method of an embodiment of the present invention is carried out.

Hereinafter, the present invention will be described in detail.

Descriptions on the configuration requirements which will be described later are made based on representative embodiments of the present invention in some cases, but it should not be construed that the present invention is limited to such embodiments.

In addition, in the present specification, a numerical value range expressed using "to" means a range that includes the preceding and succeeding numerical values of "to" as the lower limit value and the upper limit value, respectively.

In the present specification, the C log P value is a value determined by calculation of a common logarithm log P of a partition coefficient P between 1-octanol and water. With regard to a method or software used for calculation of the C log P value, a known method or software can be used, but in the present invention, a C log P program incorporated into ChemBioDraw Ultra 12.0 from Cambridge Soft is used unless otherwise specified.

In the present specification, the pH can be measured by a pH meter, and a measurement temperature is 25° C. Incidentally, a product name, "LAQUA Series" (manufactured by HORIBA, Ltd.), can be used for the pH meter.

In the present specification, psi means a pound-force per square inch; 1 psi=6,894.76 Pa.

[Polishing Liquid]

The polishing liquid of an embodiment of the present invention (hereinafter also referred to as "the present polishing liquid") is a polishing liquid used for chemical mechanical polishing (CMP) of an object to be polished (preferably an object to be polished having a cobalt-containing film), the polishing liquid including abrasive grains (preferably colloidal silica); a passivation film forming agent having a C log P value of 1.5 to 3.8; a polymer compound; and hydrogen peroxide, in which a pH is 2.0 to 4.0.

Mechanism by which a desired effect can be obtained with a polishing liquid having such a configuration is not necessarily clear, but is speculated by the present inventors to be as follows.

That is, the present polishing liquid includes abrasive grains (preferably colloidal silica) and hydrogen peroxide, and a polishing speed is ensured by setting a pH to a predetermined upper limit value or less. In addition, the occurrence of corrosion on a surface to be polished is suppressed by incorporating a passivation film forming agent and a polymer compound having a C log P value of a predetermined value or more and keeping the pH within a predetermined range. Further, it is presumed that the generation of coarse particles in the present polishing liquid is suppressed and the generation of scratches on a surface to be polished is suppressed by incorporating the passivation film forming agent having a C log P value of a predetermined value or less.

In addition, the present polishing liquid can also suppress the occurrence of dishing (phenomenon in which a surface of a wiring line exposed to a surface to be polished has a dish-shaped indentation by polishing in a case where the wiring line is formed by CMP) on a surface to be polished of an object to be polished.

Hereinafter, satisfaction of at least one or more of an excellent polishing speed, excellence in a reduction in the occurrence of corrosion on a surface to be polished (also simply referred to as an excellent corrosion suppressing property), excellence in a reduction in the occurrence of scratches on the surface to be polished (simply referred to as an excellent scratch suppressing property), and excellence in a reduction in the occurrence of dishing on the surface to be polished (simply referred to as excellent dishing suppressing property) in the polishing liquid is also expressed as follows: the effect of the present invention is excellent.

Hereinafter, components that are included in the present polishing liquid and components that can be included in the present polishing liquid will be described.

In addition, each component which will be described below may be ionized in the present polishing liquid. For example, in a case where a compound (ion) in which a carboxylic acid group (—COOH) in a compound represented by General Formula (1) which will be described later serves as a carboxylate anion ($—COO^-$) is included in the polishing liquid, the present polishing liquid is considered to include the compound represented by General Formula (1).

Incidentally, the content of each component in the following description is intended to be a content obtained by assuming the component existing in the state of being ionized in the present polishing liquid as a component in the state of being not ionized.

<Colloidal Silica (Abrasive Grains)>

The present polishing liquid includes colloidal silica (silica colloidal particles). The colloidal silica functions as abrasive grains for polishing an object to be polished.

In another aspect of the present invention, the present polishing liquid includes abrasive grains. Examples of the abrasive grains include inorganic abrasive grains such as silica, alumina, zirconia, ceria, titania, germania, and silicon carbide; and organic abrasive grains such as polystyrene, polyacryl, and polyvinyl chloride. Among those, the silica particles are preferable as the abrasive grains from the viewpoint that the dispersion stability in the polishing liquid is excellent and the number of scratches (polishing flaws) generated by CMP is small.

The silica particles are not particularly limited, and examples thereof include precipitated silica, fumed silica, and colloidal silica. Among those, the colloidal silica is more preferable.

The present polishing liquid is preferably a slurry.

An average primary particle diameter of the colloidal silica is preferably 60 nm or less, and more preferably 30 nm or less from the viewpoint that generation of defects on a surface to be polished can be further suppressed.

The lower limit value of the average primary particle diameter of the colloidal silica is preferably 1 nm or more, more preferably 3 nm or more, and still more preferably 5 nm or more from the viewpoint that the aggregation of the colloidal silica is suppressed and the temporal stability of the present polishing liquid is thus improved.

An average primary particle diameter is obtained by measuring particle diameters (equivalent circle diameters) of any 1,000 primary particles selected from an image captured using a transmission electron microscope TEM2010 (pressurization voltage: 200 kV) manufactured by JEOL Ltd., and arithmetically averaging the values. Incidentally, the equivalent circle diameter is a diameter of a circle assuming a true circle having the same projected area as a projected area of a particle at the time of observation.

It should be noted that in a case where a commercially available product is used as the colloidal silica, a catalog value is preferentially adopted as the average primary particle diameter of the colloidal silica.

An average aspect ratio of the colloidal silica is preferably 1.5 to 2.0, more preferably 1.55 to 1.95, and particularly preferably 1.6 to 1.9 from the viewpoint where a polishing power is improved.

The average aspect ratio of the colloidal silica is obtained by measuring a major diameter and a minor diameter for every arbitrary 100 particles observed with the above-mentioned transmission electron microscope to calculate aspect ratios (major diameter/minor diameter) of the respective particles, and arithmetically averaging the aspect ratios of the 100 particles. Incidentally, the major diameter of a particle means a length of the particle in a major axis direction, and the minor diameter of a particle means a length of the particle in a direction orthogonal to the major axis direction of the particle.

It should be noted that in a case where a commercially available product is used as the colloidal silica, a catalog value is preferentially adopted as the average aspect ratio of the colloidal silica.

A degree of association of the colloidal silica is preferably 1 to 3 from the viewpoint that the polishing speed is further increased.

In the present specification, the degree of association is determined by an equation: Degree of association=Average secondary particle diameter/Average primary particle diameter. An average secondary particle diameter corresponds to an average particle diameter (equivalent circle diameter) of secondary particles in an aggregated state, and can be determined by the same method as for the average primary particle diameter.

It should be noted that in a case where a commercially available product is used as the colloidal silica, a catalog value is preferentially adopted as the degree of association of the colloidal silica.

The colloidal silica may have a surface modifying group (a sulfonic acid group, a phosphonic acid group, and/or a carboxylic acid group, and the like) on the surface.

Incidentally, the group may be ionized in the polishing liquid.

A method for obtaining colloidal silica having a surface modifying group is not particularly limited, and examples thereof include the method described in JP2010-269985A.

As the colloidal silica, a commercially available product may be used, and examples thereof include PL1, PL3, PL7, PL10H, PL1D, PL07D, PL2D, and PL3D (all of which are product names, manufactured by Fuso Chemical Co., Ltd.).

The lower limit value of the content of the colloidal silica is preferably 0.1% by mass or more, more preferably 1.0% by mass or more, and still more preferably 3.0% by mass or more with respect to the total mass (100% by mass) of the present polishing liquid from the viewpoint that the dishing suppressing property of the present polishing liquid is more excellent. The upper limit value is preferably 15% by mass or less, more preferably 10% by mass or less, and still more preferably 5.5% by mass or less with respect to the total mass of the present polishing liquid from the viewpoint that the scratch suppressing property of the present polishing liquid is more excellent.

The upper limit value is preferably 1.0% to 5.5% by mass from the viewpoint that a balance of the performance of the present polishing liquid is excellent.

The colloidal silica may be used alone or in combination of two or more kinds thereof. In a case where two or more kinds of the colloidal silica are used, a total content thereof is preferably within the range.

A suitable range of the content of the abrasive grains in the present polishing liquid is the same as the suitable range of the content of the colloidal silica described above.

<Passivation Film Forming Agent>

The present polishing liquid includes a passivation film forming agent.

A C log P value of the passivation film forming agent is preferably 1.5 to 3.8, and more preferably 2.1 to 3.8.

The passivation film forming agent used in the present polishing liquid is not particularly limited as long as the C log P value is within a predetermined range and a passivation film can be formed on a surface of the cobalt-containing film. Among those, the passivation film forming agent is preferably a passivation film forming agent selected from the group consisting of a compound represented by General Formula (1) and a compound represented by General Formula (2).

(1)

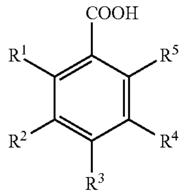

(2)

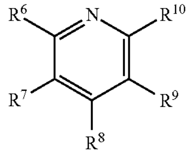

In General Formula (1), $R^1$ to $R^5$ each independently represent a hydrogen atom or a substituent.

Examples of the substituent include an alkyl group (which may be linear or branched, and preferably has 1 to 6 carbon atoms), a nitro group, an amino group, a hydroxyl group, and a carboxylic acid group.

Two adjacent groups in $R^1$ to $R^5$ may be bonded to each other to form a ring.

Examples of the ring formed by bonding two adjacent groups of $R^1$ to $R^5$ to each other include an aromatic ring (which may be a monocyclic ring or a polycyclic ring, and is preferably a benzene ring or a pyridine ring). The ring (preferably an aromatic ring, and more preferably a benzene ring or a pyridine ring) may further have a substituent.

In General Formula (2), $R^6$ to $R^{10}$ each independently represent a hydrogen atom or a substituent.

Examples of the substituent include an alkyl group (which may be linear or branched, and preferably has 1 to 6 carbon atoms), a nitro group, an amino group, a hydroxyl group, and a carboxylic acid group.

Two adjacent groups in $R^6$ to $R^{10}$ may be bonded to each other to form a ring.

Examples of the ring formed by bonding two adjacent groups of $R^6$ to $R^{10}$ to each other include an aromatic ring (which may be a monocyclic ring or a polycyclic ring, and is preferably a benzene ring or a pyridine ring). The ring (preferably an aromatic ring, and more preferably a benzene ring or a pyridine ring) may further have a substituent.

The passivation film forming agent is preferably one or more selected from the group consisting of salicylic acid, 4-methylsalicylic acid, 4-methylbenzoic acid, 4-tert-butylbenzoic acid, 4-propylbenzoic acid, 6-hydroxy-2-naphthalenecarboxylic acid, 1-hydroxy-2-naphthalenecarboxylic acid, 3-hydroxy-2-naphthalenecarboxylic acid, quinaldic acid, 8-hydroxyquinoline, and 2-methyl-8-hydroxyquinoline.

A content of the passivation film forming agent is preferably 0.001% to 5.0% by mass, more preferably 0.001% to 1.0% by mass, and still more preferably 0.005% to 0.5% by mass with respect to a total mass of the present polishing liquid from the viewpoint that the effect of the present invention is more excellent.

The passivation film forming agents may be used alone or in combination of two or more kinds thereof. In a case where two or more kinds of the passivation film forming agents are used, a total content thereof is preferably within the range.

<Polymer Compound>

The present polishing liquid includes a polymer compound.

The polymer compound is preferably an anionic polymer compound (for example, a polymer compound having a carboxylic acid group).

Examples of the anionic polymer compound include a polymer having a monomer having a carboxyl acid group as a basic constitutional unit and a salt thereof, and a copolymer including them. Specific examples of the anionic polymer compound include a polyacrylic acid and a salt thereof, and a copolymer including them; a polymethacrylic acid and a salt thereof, and a copolymer including them; a polyamic acid and a salt thereof, and a copolymer including them; and polycarboxylic acids such as polymaleic acid, polyitaconic acid, polyfumaric acid, poly(p-styrenecarboxylic acid), and polyglioxylic acid, and a salt thereof, and a copolymer including them.

Among those, at least one selected from the group consisting of a copolymer including polyacrylic acid, polymethacrylic acid, polyacrylic acid and polymethacrylic acid, and a salt thereof is preferably included.

A content of a constitutional unit based on a monomer having a carboxylic acid group in the anionic polymer compound is preferably 30% to 100% by mole, more preferably 75% to 100% by mole, and still more preferably 95% to 100% by mole with respect to all the repeating units.

The anionic polymer compound may be ionized in the polishing liquid.

A weight-average molecular weight of the polymer compound is preferably 500 to 100,000, more preferably 1,000 to 50,000, and still more preferably 2,000 to 30,000.

In a case where the weight-average molecular weight of the polymer compound is a certain value or more, the corrosion suppressing property of the polishing liquid is more excellent; and in a case where the weight-average molecular weight of the polymer compound is a certain value or less, the scratch suppressing property of the present polishing liquid is more excellent.

The weight-average molecular weight of the polymer compound is a polystyrene-equivalent value obtained by a gel permeation chromatography (GPC) method. The GPC method is based on a method using HLC-8020GPC (manufactured by Tosoh Corporation), and using TSKgel Super-HZM-H, TSKgel SuperHZ4000, and TSKgel SuperHZ2000 (manufactured by Tosoh Corporation, 4.6 mm ID×15 cm) as columns and tetrahydrofuran (THF) as an eluent.

The lower limit value of the content of the polymer compound is preferably 0.01% by mass or more, more preferably 0.05% by mass or more with respect to the total mass of the present polishing liquid from the viewpoint that the corrosion suppressing property is more excellent.

The upper limit value of the content of the polymer compound is preferably 10.0% by mass or less, more preferably 5.0% by mass or less, and still more preferably 3.0% by mass or less with respect to the total mass of the present polishing liquid from the viewpoint that the scratch suppressing property is more excellent.

The polymer compounds may be used alone or in combination of two or more kinds thereof. In a case where two or more kinds of the polymer compounds are used in combination, a total content thereof is preferably within the range.

In addition, a mass ratio (content of the passivation film forming agent/content of the polymer compound) of the content of the passivation film forming agent to the content of the polymer compound in the present polishing liquid is preferably 0.005 to 20, and more preferably 0.05 or more and less than 10 from the viewpoint that the effect of the present invention is more excellent.

<Hydrogen Peroxide>

The present polishing liquid includes hydrogen peroxide ($H_2O_2$).

A content of hydrogen peroxide is preferably 0.005% to 10% by mass, more preferably 0.01% to 1.0% by mass, and still more preferably 0.05% to 0.5% by mass with respect to the total mass of the present polishing liquid.

<Water>

It is preferable that the present polishing liquid includes water. The water contained in the present polishing liquid is not particularly limited, and examples thereof include ion exchange water and pure water.

A content of water is preferably 80% to 99% by mass, and more preferably 90% to 99% by mass with respect to the total mass of the present polishing liquid.

<Cationic Compound>

It is also preferable that the present polishing liquid includes a cationic compound.

The central element of the cation (onium ion) included in the cationic compound is preferably a phosphorus atom or a nitrogen atom.

The cationic compound is preferably a compound other than a surfactant.

Examples of the cations having a nitrogen atom as the central element among the cations included in the cationic compound include ammonium such as tetramethylammonium, tetraethylammonium, tetrapropylammonium, tetrabutylammonium, tetrapentylammonium, tetraoctylammonium, ethyltrimethylammonium, and diethyldimethylammonium.

Examples of the cations having a phosphorus atom as the central element among the cations included in the cationic compound include phosphonium such as tetramethylphosphonium, tetraethylphosphonium, tetrapropylphosphonium, tetrabutylphosphonium, tetraphenylphosphonium, methyltriphenylphosphonium, ethyltriphenylphosphonium, butyltriphenylphosphonium, benzyltriphenylphosphonium, dimethyldiphenylphosphonium, hydroxymethyltriphenylphosphonium, and hydroxyethyltriphenylphosphonium.

The cation included in the cationic compound preferably has a symmetrical structure. Here, "having a symmetrical structure" means that the molecular structure corresponds to any of point symmetry, line symmetry, and rotational symmetry.

In addition, the cation included in the cationic compound is preferably a quaternary cation in which a hydrogen atom bonded to a central element is substituted with an atomic group other than the hydrogen atom. Examples of the quaternary cation include a quaternary ammonium cation and a quaternary phosphonium cation. That is, the present polishing liquid preferably includes, as the cationic compound, a compound including a cation selected from the group consisting of a quaternary ammonium cation and a quaternary phosphonium cation.

Examples of the anion constituting the cationic compound include a hydroxide ion, a chloride ion, a bromine ion, an iodide ion, and a fluorine ion, and the hydroxide ion is more preferable from the viewpoint that the occurrence of defects on a surface to be polished can be further suppressed.

The cationic compound may be ionized in the polishing liquid.

In particular, the polishing liquid preferably has, as the cation included in the cationic compound, a cation having a phosphorus atom or a nitrogen atom as a central element, and 2 to 10 carbon atoms (preferably 3 to 8 carbon atoms, and more preferably 4 to 8 carbon atoms) bonded to the central element. As a result, the occurrence of defects on a surface to be polished can be further suppressed.

Here, specific examples of the group including 2 to 10 carbon atoms bonded to the central element include a linear, branched, or cyclic alkyl group, an aryl group which may be substituted with an alkyl group, a benzyl group, and an aralkyl group.

Specific examples of the cation having a phosphorus atom or a nitrogen atom as the central element and a group including 2 to 10 carbon atoms bonded to the central element include tetraethylammonium, tetrapropylammonium, tetrabutylammonium, tetrapentylammonium, tetraoctylammonium, tetraethylphosphonium, tetrapropylphosphonium, tetrabutylphosphonium, and tetraphenylphosphonium.

From the viewpoint that the occurrence of defects on a surface to be polished can be further suppressed, it is preferable that the cationic compound includes at least one selected from the group consisting of tetramethylammonium hydroxide (TMAH), tetraethylammonium hydroxide, tetrapropylammonium hydroxide, tetrabutylammonium hydroxide (TBAH), tetraoctylammonium hydroxide, 2-hydroxyethyltrimethylammonium hydroxide (choline), tetrabutylphosphonium hydroxide (TBPH), and tetrapropylphosphonium hydroxide (TPPH).

Among those, the cationic compound preferably includes TBAH, TMAH, choline, TBPH, or TPPH.

A content of the cationic compound is preferably more than 0.01% by mass, and more preferably 0.1% by mass or more with respect to the total mass of the present polishing liquid.

The upper limit value of the content of the cationic compound is preferably 5.0% by mass or less, and more preferably 3.0% by mass or less with respect to the total mass of the present polishing liquid.

Furthermore, the cationic compounds may be used alone or in combination of two or more kinds thereof. In a case where two or more kinds of the cationic compounds are used in combination, a total content thereof is preferably within the range.

In a case where the present polishing liquid includes the cationic compound, a mass ratio (content of the passivation film forming agent/content of the cationic compound) of the content of the passivation film forming agent to the content of the cationic compound is preferably 0.001 or more, and more preferably 0.01 or more from the viewpoint that the corrosion suppressing property is more excellent. In addition, the upper limit of the mass ratio is preferably 5.0 or less, and more preferably 2.0 or less.

In a case where the present polishing liquid includes the cationic compound, a mass ratio (content of the polymer compound/content of the cationic compound) of the content of the polymer compound to the content of the cationic compound is preferably 50 or less, and more preferably less than 10 from the viewpoint that the corrosion suppressing property is more excellent. In addition, the lower limit of the mass ratio is preferably 0.005 or more, more preferably 0.01 or more.

<Benzotriazole Compound>

It is also preferable that the present polishing liquid includes a benzotriazole compound (a compound having a benzotriazole structure).

The benzotriazole compound is not particularly limited as long as it is the compound having a benzotriazole structure. Among those, the benzotriazole compound is preferably a compound represented by Formula (A).

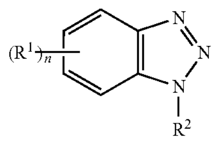

In Formula (A), $R^1$'s each independently represent a substituent.

The substituent represented by $R^1$ is preferably an alkyl group having 1 to 6 carbon atoms, an alkoxy group having 1 to 6 carbon atoms, an aryl group having 6 to 14 carbon atoms, a group represented by Formula (B), a hydroxyl group, a mercapto group, or an alkoxycarbonyl group having 1 to 6 carbon atoms.

n is an integer of 0 to 4, and in a case where n is 2 or more, n pieces of $R^1$'s may be the same as or different from each other.

$R^2$ represents a hydrogen atom or a substituent.

The substituent represented by $R^2$ is preferably an alkyl group having 1 to 12 carbon atoms, an alkoxy group having 1 to 12 carbon atoms, an aryl group having 6 to 14 carbon atoms, a group represented by Formula (B), a hydroxyl group, a mercapto group, or an alkoxycarbonyl group having 1 to 12 carbon atoms.

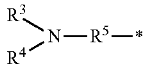

(B)

In Formula (B), $R^3$ and $R^4$ each independently represent a hydrogen atom or a substituent (preferably an alkyl group having 1 to 10 carbon atoms).

$R^5$ represents a single bond or an alkylene group having 1 to 6 carbon atoms,

* represents a bonding site.

Examples of the benzotriazole compound include benzotriazole, 5-methyl-1H-benzotriazole, 1-hydroxybenzotriazole, 5-aminobenzotriazole, 5,6-dimethylbenzotriazole, 1-[N,N-bis(hydroxyethyl)aminoethyl]benzotriazole, 1-(1,2-dicarboxyethyl)benzotriazole, tolyltriazole, 1-[N,N-bis(2-ethylhexyl)aminomethyl]benzotriazole, 1-[N,N-bis(2-ethylhexyl)aminomethyl]methylbenzotriazole, 2,2'-{[(methyl-1H-benzotriazol-1-yl)methyl]imino}bisethanol, and carboxybenzotriazole.

It is also preferable to use two or more of the benzotriazole compounds.

Examples of a combination of the two or more kinds used include a combination of 1-hydroxybenzotriazole and 5-methyl-1H-benzotriazole.

In a case where two or more of the benzotriazole compounds are used, a mass ratio (content of the benzotriazole compound with the highest content/content of the benzotriazole compound with the second highest content) of the content of the benzotriazole compound with the highest content to the content of the benzotriazole compound with the second highest content is preferably 0.1 to 1.0, and more preferably 0.3 to 0.7. Incidentally, the content of the benzotriazole compound with the highest content may be substantially the same as the content of the benzotriazole compound with the second highest content.

In a case where the present polishing liquid includes the benzotriazole compound, a content of the benzotriazole compound is preferably 0.001% to 3.0% by mass, and more preferably 0.01% to 0.5% by mass with respect to the total mass of the present polishing liquid from the viewpoint that the effect of the present invention is more excellent.

In a case where two or more kinds of the benzotriazole compounds are used, a total content thereof is preferably within the range.

In a case where the present polishing liquid includes the benzotriazole compound, a mass ratio of the content of the passivation film forming agent to the content of the benzotriazole compound is preferably 0.001 to 20, and more preferably 0.01 to 4.0.

<Anionic Surfactant>

The present polishing liquid includes an anionic surfactant.

The anionic surfactant is preferably a compound different from the above-mentioned polymer compound.

The anionic surfactant is preferably a compound different from the above-mentioned passivation film forming agent.

In the present invention, the anionic surfactant is not particularly limited, but typically means an anionic compound having a hydrophilic group and a lipophilic group in the molecule, in which the hydrophilic group portion is dissociated in an aqueous solution to serve as an anion or have an anionic property. Here, the anionic surfactant may be present as an acid accompanied by a hydrogen atom, may be a dissociated anion, or may be a salt thereof. As long as the surfactant is anionic, it may be non-dissociative and includes an acid ester and the like.

The anionic surfactant is preferably an anionic surfactant having one or more anionic groups selected from the group consisting of a carboxylic acid group, a sulfonic acid group, a phosphoric acid group, a phosphonic acid group, a sulfuric acid ester group, a phosphoric acid ester group, and a group which is a salt thereof.

In other words, the anionic surfactant is preferably an anionic surfactant having one or more anions selected from the group consisting of a carboxylate anion ($—COO^-$), a sulfonate anion ($—SO_3^-$), a phosphate anion ($—OPO_3H^-$, $—OPO_3^{2-}$), a phosphonate anion ($—PO_3H^-$, $—PO_3^{2-}$), a sulfuric acid ester anion ($—OSO_3^-$), a phosphoric acid ester anion ($*—O—P(=O)O^-—O—*$, in which * represents a bonding position with an atom other than a hydrogen atom), in the present polishing liquid.

In addition, the anionic surfactant preferably has two or more of the anionic groups. In this case, the two or more anionic groups which are present may be the same as or different from each other.

Examples of the anionic surfactant include a sulfonic acid compound, an alkyl sulfuric acid ester, an alkyl sulfonic acid, an alkylbenzenesulfonic acid (preferably having 8 to 20 carbon atoms), an alkylnaphthalenesulfonic acid, an alkyldiphenyl ether sulfonic acid, a polyoxyethylene alkyl ether carboxylic acid, a polyoxyethylene alkyl ether acetic acid, a polyoxyethylene alkyl ether propionic acid, an alkyl phosphate, and a salt thereof. Examples of the "salt" include an ammonium salt, a sodium salt, a potassium salt, a trimethylammonium salt, and a triethanolamine salt.

In a case where the present polishing liquid includes the anionic surfactant, a content of the anionic surfactant is preferably 0.0005% to 5.0% by mass, and more preferably 0.002% to 0.3% by mass with respect to the total mass of the present polishing liquid from the viewpoint that the effect of the present invention is more excellent.

The anionic surfactants may be used alone or in combination of two or more kinds thereof. In a case where two or more kinds of the anionic surfactants are used, a total content thereof is preferably within the range.

<Nonionic Surfactant>

It is also preferable that the present polishing liquid includes a nonionic surfactant.

Examples of the nonionic surfactant include polyalkylene oxide alkylphenyl ether-based surfactants, polyalkylene oxide alkyl ether-based surfactants, block polymer-based surfactants consisting of polyethylene oxide and polypropylene oxide, polyoxyalkylene distyrenated phenyl ether-based surfactants, polyalkylene tribenzyl phenyl ether-based surfactants, and acetylene polyalkylene oxide-based surfactants.

The nonionic surfactant is preferably a compound represented by General Formula (A1).

(A1)

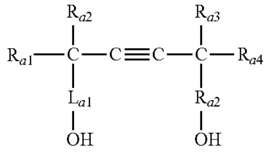

In General Formula (A1), $R_{a1}$, $R_{a2}$, $R_{a3}$ and $R_{a4}$ each independently represent an alkyl group.

The alkyl group of each of $R_{a1}$, $R_{a2}$, $R_{a3}$ and $R_{a4}$ may be linear or branched, and may have a substituent.

The alkyl group of each of $R_{a1}$, $R_{a2}$, $R_{a3}$ and $R_{a4}$ is preferably an alkyl group having 1 to 5 carbon atoms. Examples of the alkyl group having 1 to 5 carbon atoms include a methyl group, an ethyl group, an isopropyl group, and a butyl group.

In General Formula (A1), $L_{a1}$ and $L_{a2}$ each independently represent a single bond or a divalent linking group.

The divalent linking group of each of $L_{a1}$ and $L_{a2}$ is preferably an alkylene group, a $—OR_{a5}—$ group, or a combination thereof. $R_{a5}$ represents an alkylene group (preferably having 1 to 8 carbon atoms).

The compound represented by General Formula (A1) may be, for example, a compound represented by General Formula (A2).

(A2)

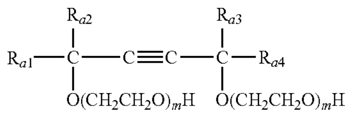

In General Formula (A2), $R_{a1}$, $R_{a2}$, $R_{a3}$, and $R_{a4}$ each independently represent an alkyl group.

The alkyl group of each of $R_{a1}$, $R_{a2}$, $R_{a3}$, and $R_{a4}$ is the same as the alkyl group of each of $R_{a1}$, $R_{a2}$, $R_{a3}$, and $R_{a4}$ in General Formula (A1).

In General Formula (A2), m and n represent the addition number of ethylene oxide, each independently represent a positive number of 0.5 to 80, and satisfy $m+n\geq1$. Any value can be selected as long as the range satisfies $m+n\geq1$. m and n preferably satisfy $1\leq m+n\leq100$, and more preferably satisfy $3\leq m+n\leq80$.

Examples of the nonionic surfactant include 2,4,7,9-tetramethyl-5-decyne-4,7-diol, 3,6-dimethyl-4-octyne-3,6-diol, 3,5-dimethyl-1-hexyne-triol, 2,5,8,11-tetramethyl-6-dodecyne-5,8-diol, 5,8-dimethyl-6-dodecyne-5,8-diol, 4,7-dimethyl-5-decyne-4,7-diol 8-hexadecyne-7,10-diol, 7-tetradecyne-6,9-diol, 2,3,6,7-tetramethyl-4-octyne-3,6-diol, 3,6-diethyl-4-octyne-3,6-diol, 3,6-dimethyl-4-octyne-3,6-diol, and 2,5-dimethyl-3-hexyne-2,5-diol.

In addition, as the nonionic surfactant, a commercially available product may be used. Examples of the commercially available product include SURFYNOL 61, 82, 465, 485, DYNOL 604, 607 manufactured by Air Products & Chemicals, Inc., and OLFINE STG and OLFINE E1010 manufactured by Nissin Chemical Co., Ltd.

A hydrophile-lipophile balance (HLB) value of the nonionic surfactant is preferably 3 to 20, more preferably 8 to 17, still more preferably 8 to 15, and particularly preferably 10 to 14.

Here, the HLB value is defined with a value calculated from a Griffin Formula (20 Mw/M; Mw=Molecular weight of a hydrophilic site, M=Molecular weight of a nonionic surfactant).

In a case where the present polishing liquid includes the nonionic surfactant, a content of the nonionic surfactant is preferably 0.0001% to 1.0% by mass, and more preferably 0.001% to 0.05% by mass with respect to the total mass of the present polishing liquid from the viewpoint that the effect of the present invention is more excellent.

The nonionic surfactants may be used alone or in combination of two or more kinds thereof. In a case where two or more kinds of the nonionic surfactants are used, a total content thereof is preferably within the range.

<Organic Acid>

It is also preferable that the present polishing liquid includes an organic acid.

The organic acid is one or more selected from the group consisting of polycarboxylic acid and polyphosphonic acid.

The polycarboxylic acid is a compound having 2 or more (preferably 2 to 4) carboxylic acid groups (—COOH) in one molecule, and the polyphosphonic acid is a compound having 2 or more (preferably 2 to 4) phosphonic acid groups ($—P(═O)(OH)_2$) in one molecule.

Examples of the polycarboxylic acid include citric acid, maleic acid, malic acid, and succinic acid.

Examples of the polyphosphonic acid include 1-hydroxyethane-1,1-diphosphonic acid and ethylenediaminetetramethylenephosphonic acid.

The organic acid is preferably different from the above-mentioned polymer compounds.

The organic acid is preferably different from the above-mentioned anionic surfactants.

The organic acid is preferably different from the above-mentioned passivation film forming agents.

It is also preferable to use two or more kinds of the organic acids.

Examples of a combination of the two or more kinds used include a combination of citric acid and malonic acid, a combination of malic acid and ethylenediaminetetramethylenephosphonic acid, and a combination of malonic acid and ethylenediaminetetramethylenephosphonic acid.

In a case where two or more kinds of the organic acids are used, a mass ratio (content of the organic acid with the second highest content of the organic acid with the highest content) of an content of the organic acid with the second highest content to a content of the organic acid with the highest content is preferably 0.1 to 1.0, and more preferably 0.2 to 1.0. Incidentally, the content of the organic acid with the highest content may be substantially the same as the content of the organic acid with the second highest content.

A content of the organic acid is preferably 0.001% to 8.0% by mass, and more preferably 0.05% to 4.0% by mass with respect to the total mass of the present polishing liquid.

In a case where two or more kinds of the specific compounds are used, a total content thereof is preferably within the range.

<Organic Solvent>

It is also preferable that the present polishing liquid includes an organic solvent.

The organic solvent is preferably a water-soluble organic solvent.

Examples of the organic solvent include ketone-based solvents, ether-based solvents, alcohol-based solvents, glycol-based solvents, glycol ether-based solvents, and amide-based solvents.

More specific examples thereof include acetone, methyl ethyl ketone, tetrahydrofuran, dioxane, dimethylacetamide, N-methylpyrrolidone, dimethylsulfoxide, acetonitrile, methanol, ethanol, 1-propanol, 2-propanol, 1-butanol, ethylene glycol, propylene glycol, 3-methoxy-3-methylbutanol, and ethoxyethanol.

Among those, 3-methoxy-3-methylbutanol is preferable.

In a case where the present polishing liquid includes the organic solvent, a content of the organic solvent is preferably 0.001% to 10% by mass, and more preferably 0.05% to 5% by mass with respect to the total mass of the polishing liquid from the viewpoint that the effect of the present invention is more excellent.

The organic solvents may be used alone or in combination of two or more kinds thereof. In a case where two or more kinds of the organic solvents are used in combination, a total content thereof is preferably within the range.

<pH Adjuster>

In addition to the above-mentioned components, the present polishing liquid may include a pH adjuster for adjusting a pH to a predetermined range.

Examples of the pH adjuster for adjusting a pH to an acidic side include sulfuric acid, and examples of the pH adjuster for adjusting the pH to a basic side include ammonia (aqueous ammonia).

The pH adjuster may be used in an amount suitable for adjusting the pH to a predetermined pH.

The pH adjusters may be used alone or in combination of two or more kinds thereof.

The pH of the present polishing liquid is 2.0 to 4.0. Among those, the pH of the present polishing liquid is preferably 2.5 to 3.8 from the viewpoint that the effect of the present invention is more excellent.

<Other Components>

The present polishing liquid may include components (other components) other than the above-mentioned components as long as the above-mentioned effects of the present invention are not impaired.

Examples of other components include nitrogen-containing heterocyclic compounds other than the benzotriazole compound, surfactants other than the above-mentioned surfactants, and particles other than colloidal silica.

<Zeta Potential>

A zeta potential potential) of the colloidal silica as measured in the state where the colloidal silica are present in the polishing liquid is preferably +10.0 mV or more, more preferably +20.0 mV or more, and still more preferably +20.0 to +40.0 mV.

In the present invention, the "zeta potential potential)" means a potential on a "slip plane" of a diffusion electric double layer that is present around particles (colloidal silica) in a liquid (the present polishing liquid). The "slip plane" is a plane that can be regarded as a hydrodynamic surface of particles as the particles move in a liquid.

The diffusion electric double layer has a fixing layer formed on a surface side of particles (colloidal silica) and a diffusion layer formed on the outside of the fixing layer. Here, the fixing layer is a layer in which ions are attracted and fixed around particles (colloidal silica) whose surfaces are charged. The diffusion layer is a layer in which ions are freely diffused by thermal motion.

The slip plane is present in a boundary region between the fixing layer and the diffusion layer. In a case where particles are electrophoresed, the migration distance changes depending on the potential (zeta potential) of the slip plane. Therefore, the zeta potential of the particles can be measured by electrophoresis.

The zeta potential (mV) of the colloidal silica in the present polishing liquid can be measured using a zeta potential measuring device DT-1200 (product name, manufactured by Dispersion Technology Inc. and sold by Nihon Rufuto Co., Ltd.). Furthermore, the measurement temperature is 25° C.

<Method for Manufacturing Present Polishing Liquid>

A method for producing the present polishing liquid is not particularly limited, and a known production method can be used.

For example, the present polishing liquid may be produced by mixing each of the above-mentioned components to have a predetermined concentration.

Moreover, the present polishing liquid adjusted to a high concentration (high-concentration polishing liquid) may be diluted to obtain the present polishing liquid having a desired formulation. The high-concentration polishing liquid is a mixture of which formulation is adjusted so that the present polishing liquid having a desired formulation can be produced by dilution with water or the like.

The dilution ratio in the dilution of the high-concentration polishing liquid is preferably 3 times or more, and more preferably 3 to 20 times, on a mass basis.

The concentration of solid contents of the high-concentration polishing liquid is preferably 10% by mass or more, and more preferably 10% to 50% by mass. It is preferable to dilute the high-concentration polishing liquid to obtain the present polishing liquid having a preferred concentration of solid contents (preferably 0.1% to 10% by mass, and more preferably 1.5% by mass or more and less than 10% by mass).

Incidentally, the solid contents are intended to be all components other than water, hydrogen peroxide, and the organic solvent in the present polishing liquid.

[Chemical Mechanical Polishing Method]

A chemical mechanical polishing method of an embodiment of the present invention (hereinafter also referred to as a "CMP method") includes a step of obtaining an object to be polished, which has been polished, by bringing a surface to be polished of an object to be polished into contact with a polishing pad while supplying the above-mentioned polishing liquid to the polishing pad attached to a polishing platen, and relatively moving the object to be polished and the polishing pad to polish the surface to be polished.

<Object to be Polished>

An object to be polished to which the CMP method according to the embodiment can be applied is not particularly limited and includes an aspect in which the object to be polished has a film containing at least one metal selected from the group consisting of copper, an copper alloy, and cobalt as a wiring line metal element, and an aspect in which the object to be polished has a cobalt-containing film is preferable.

The cobalt-containing film only needs to include at least cobalt (Co) and may include other components. The state of cobalt in the cobalt-containing film is not particularly limited, and may be, for example, a simple substance or an alloy. Above all, the cobalt in the cobalt-containing film is preferably cobalt as the simple substance. A content of cobalt (preferably cobalt as a simple substance) in the cobalt-containing film is preferably 50% to 100% by mass, more preferably 80% to 100% by mass, and still more preferably 99% to 100% by mass with respect to a total mass of the cobalt-containing film.

An example of the object to be polished can be a substrate having a cobalt-containing film on the surface.

More specific examples of the object to be polished include an object to be polished in FIG. 2 which will be described later, and the object to be polished in FIG. 2 can be obtained by, for example, subjecting the object to be pretreated shown in FIG. 1 which will be described to a pretreatment.

FIG. 1 shows a schematic view of an upper part of a cross-section showing an example of an object to be pretreated, which is subjected to a pretreatment for obtaining an object to be polished for which the present CMP method is carried out.

An object 10*a* to be pretreated shown in FIG. 1 includes a substrate not shown in the drawing, an interlayer insulating film 16 having a groove (for example, a groove for a wiring line) arranged on the substrate, a barrier layer 14 arranged along the shape of the groove, and a cobalt-containing film 12 arranged so that the groove is filled therewith. The cobalt-containing film with which the groove is filled is arranged at a position higher than an opening of the groove to further overflow. Such a portion of the cobalt-containing film 12, which is formed at a position higher than the opening of the groove, is referred to as a bulk layer 18.

In the object 10*a* to be pretreated, the barrier layer 14 which is present between the interlayer insulating film 16 and the cobalt-containing film 12 may be omitted.

The object 10*a* to be pretreated may have a stop layer (etching stop layer) between the cobalt-containing film 12 and the barrier layer 14, between the barrier layer 14 and the interlayer insulating film 16, and/or between the interlayer insulating film 16 and the cobalt-containing film 12 in a case where the barrier layer 14 is omitted. In addition, the barrier layer may also serve as the stop layer.

The bulk layer 18 of the object 10*a* to be pretreated can be removed (pretreatment) to obtain an object to be polished in FIG. 2 which will be described below.

The removal of the bulk layer 18 can be carried out by, for example, CMP using a polishing liquid different from the polishing liquid of the embodiment of the present invention.

Figure 2:
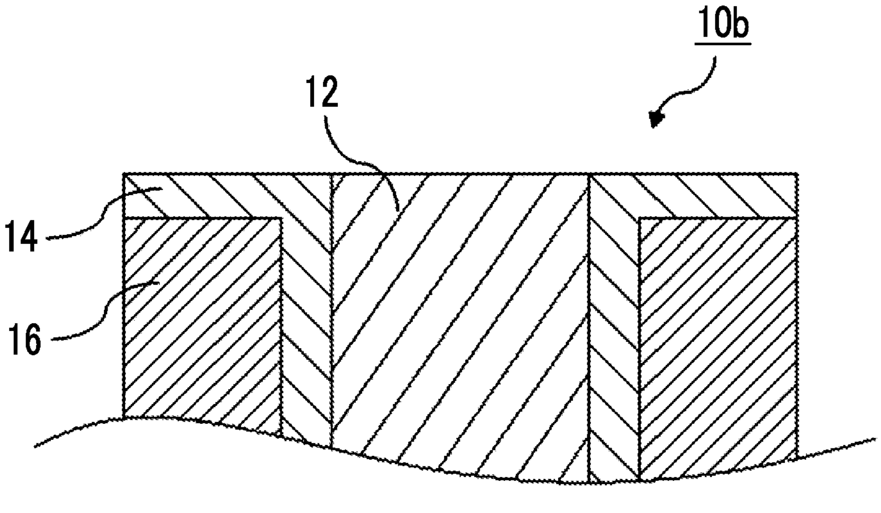
FIG. 2 is a schematic view of an upper part of a cross-section showing an example of an object to be polished for which a chemical mechanical polishing method of the embodiment of the present invention is carried out.

FIG. 2 is a schematic view of an upper part of a cross-section showing an example of an object to be polished for which the present CMP method is carried out.

In the object 10*b* to be polished in FIG. 2, the bulk layer is removed from the object 10*a* to be pretreated in FIG. 1, and thus, the barrier layer 14 and the cobalt-containing film 12 are exposed on the surface to be treated.

Figure 3:
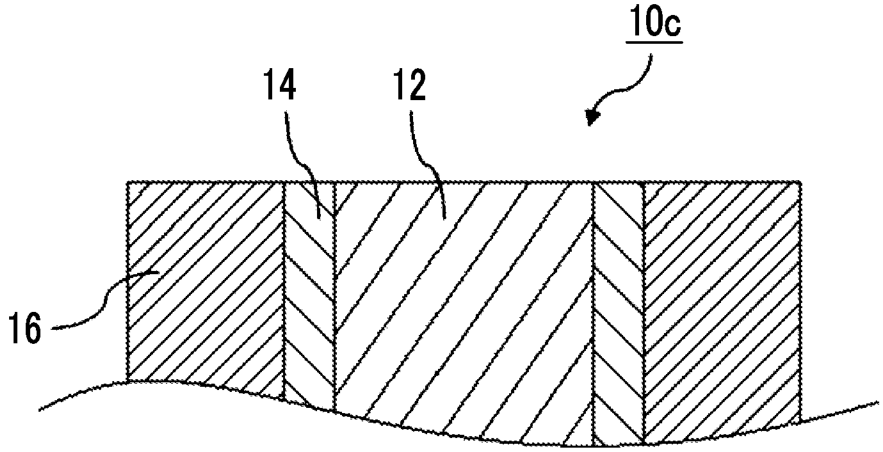
FIG. 3 is a schematic view of an upper part of a cross-section showing an example of an object to be polished, which has been polished, obtained by carrying out the chemical mechanical polishing method of the embodiment of the present invention.

In the present CMP method, it is preferable that the barrier layer 14 and the cobalt-containing film 12 exposed on the surface to be treated are polished at the same time, and the interlayer insulating film 16 is polished until it is exposed on the surface to be polished, thereby obtaining an object 10*c* to be polished, which has been polished, in FIG. 3 having a wiring line consisting of a cobalt-containing film.

That is, the present CMP method is preferably performed to form a wiring line consisting of a cobalt-containing film.

Even after the interlayer insulating film 16 is exposed on the surface to be polished, the polishing of the interlayer insulating film 16, the barrier layer 14 arranged along the shape of the grooves of the interlayer insulating film 16, and the cobalt-containing film 12 (wiring line) with which the grooves are filled, and/or the stop layer which is contained as desired may be intentionally or unavoidably continued.

Incidentally, in the object 10*b* to be polished in FIG. 2, the bulk layer is completely removed, but a part of the bulk layer may not be completely removed, and the bulk layer which has not been completely removed may partially or completely cover a surface to be treated of the object 10*b* to be polished. In the present CMP method, such a bulk layer which has not been completely removed may also be polished and removed.

As described above, the object 10*a* to be pretreated may have a stop layer. Thus, the object 10*b* to be polished may also have a stop layer. For example, the object 10*b* to be polished in the state where the stop layer partially or completely covers the surface to be polished of the barrier layer 14 and/or the interlayer insulating film 16 may be obtained.

In addition, in the object 10*c* to be polished, which has been polished, in FIG. 3, the barrier layer 14 on the interlayer insulating film 16 is completely removed, but the polishing may be completed before the barrier layer 14 on the interlayer insulating film 16 is completely removed and cut. That is, the object to be polished, which has been polished, may be obtained by finishing the polishing in the state where the barrier layer 14 partially or completely covers the interlayer insulating film 16.

As described above, the object 10*b* to be polished may have a stop layer. Thus, the object 10*c* to be polished, which has been polished, may also have a stop layer. For example, the object 10*c* to be polished, which has been polished, may be obtained by finishing polishing in the state where the stop layer partially or completely covers the interlayer insulating film 16.

Examples of the interlayer insulating film 16 include an interlayer insulating film including one or more materials selected from a group consisting of silicon nitride (SiN), silicon oxide, silicon carbide (SiC), silicon carbonitride, silicon oxycarbide (SiOC), silicon oxynitride, and tetraethoxysilane (TEOS). Among those, silicon nitride (SiN), TEOS, silicon carbide (SiC), and silicon oxycarbide (SiOC) are preferable. In addition, the interlayer insulating film 16 may be formed of a plurality of films. Examples of the interlayer insulating film formed of a plurality of films include an insulating film formed by combining a film including silicon oxide and a film including silicon oxycarbide.

Examples of the barrier layer 14 include a barrier layer including one or more materials selected from the group consisting of Ta, TaN, TiN, TiW, W, and WN. Among those, Ta, TaN, or TiN is preferable.

Examples of the stop layer include a stop layer including a material which can be used for a barrier layer and/or silicon nitride.

Specific examples of the substrate include a semiconductor substrate consisting of a single layer and a semiconductor substrate consisting of multiple layers.

Specific examples of the material constituting the semiconductor substrate consisting of a single layer include Groups III to V compounds such as silicon, silicon germanium, and GaAs, or any combination thereof.

Specific examples of the semiconductor substrate consisting of multiple layers include a substrate in which an exposed integrated circuit structure such as interconnect features such as a metal wire and a dielectric material is arranged on the above-mentioned semiconductor substrate such as silicon.

Examples of a commercially available products of the object to be polished to which the present CMP method is applied include SEMATECH 754TEG (manufactured by SEMATECH Inc.).

<Ratio of Polishing Speed>

As in the polishing of the object to be polished shown in FIG. 2 as described above, in the present CMP method, it is preferable that the object to be polished has a second layer (a barrier layer, a stop layer, a stop layer, and/or an interlayer insulating film, and the like) consisting of a material different from the cobalt-containing film (first layer). In addition, it is preferable that the second layer is polished at the same time as the cobalt-containing film (first layer).

That is, in the present CMP method, it is preferable that a cobalt-containing film as the first layer and a layer consisting of a material different from the cobalt-containing film (a barrier layer, a stop layer, and/or an interlayer insulating film, and the like) as the second layer are polished at the same time.

Both the first layer and the second layer may be exposed at the same time on the surface to be polished on the same plane in the polishing, as in the object to be polished shown in FIG. 2.

At this time, it is preferable that the difference between the polishing speed with respect to the first layer and the polishing speed with respect to the second layer is not extremely large from the viewpoint of the uniformity of the surface to be polished of the obtained object to be polished, which has been polished.

Specifically, a speed ratio (polishing speed of the first layer/polishing speed of the second layer) of the polishing speed of the first layer to the polishing speed of the second layer is preferably more than 0.01 and 20 or less, and more preferably more than 0.05 and less than 5.

The second layer is, for example, a barrier layer, a stop layer, and/or an interlayer insulating film. More specifically, the second layer is preferably, for example, a layer including one or more materials selected from the group consisting of Ta, TaN, TiN, SiN, tetraethoxysilane (TEOS), SiC, and SiOC. In the present CMP method, the speed ratio ("polishing speed of the cobalt-containing film (preferably Co)"/"polishing speed of TiN, Ta, TaN, SiN, TEOS, SiOC, and/or SiC") of the polishing speed of the cobalt-containing film (preferably Co) to the polishing speed of TiN, Ta, TaN, SiN, TEOS, SiOC, and/or SiC is preferably more than 0.01 and 20 or less, and more preferably more than 0.05 and less than 5.

<Polishing Device>

A known chemical mechanical polishing device (hereinafter also referred to as a "CMP device") can be used as a polishing device with which the present CMP method can be carried out.

Examples of the CMP device include a general CMP device having a holder for holding an object to be polished having a surface to be polished, and a polishing platen to which a polishing pad is attached (to which a motor or the like with a rotation speed being changeable is attached).

<Polishing Pressure>

A polishing pressure in the present CMP method is preferably 0.1 to 5.0 psi, more preferably 0.5 to 3.0 psi, and still more preferably 1.0 to 3.0 psi from the viewpoint that occurrence of erosion (phenomenon in which portions other than a wiring line are partially scraped in a case where the wiring line is formed by CMP) on a surface to be polished can be suppressed, and the surface to be polished after polishing is likely to be uniform. Furthermore, the polishing pressure means a pressure generated on a contact surface between the surface to be polished and the polishing pad.

<Rotation Speed of Polishing Platen>

A rotation speed of the polishing platen in the present CMP method is preferably 50 to 200 rpm, and more preferably 60 to 150 rpm.

Incidentally, in order to relatively move the object to be polished and the polishing pad, the holder may be rotated and/or rocked, the polishing platen may be rotated by planetary rotation, or a belt-shaped polishing pad may be moved linearly in one of longitudinal directions. Furthermore, the holder may be in any state of being fixed, rotating, or rocked. These polishing methods can be appropriately selected depending on a surface to be polished and/or a polishing device as long as the object to be polished and the polishing pad are relatively moved.

<Method for Supplying Polishing Liquid>

In the present CMP method, it is preferable to continuously supply the present polishing liquid to the polishing pad on the polishing platen by a pump or the like while polishing the surface to be polished. Although an amount of the present polishing liquid to be supplied is not limited, it is preferable that a surface of the polishing pad is always covered with the present polishing liquid.

For example, a supply rate of the polishing liquid is preferably 0.05 to 0.75 ml/(min·$cm^2$), more preferably 0.14 to 0.35 ml/(min·$cm^2$), and still more preferably 0.21 to 0.35 ml/(min·$cm^2$) from the viewpoint that residues (residues of a polishing sludge generated by polishing and/or residues based on the components included in the present polishing liquid, and the like, in which the residues may be in the form of particles or non-particles) on the surface to be polished hardly remain, and the surface to be polished is likely to be uniform after polishing.

Furthermore, "ml/(min·$cm^2$)" in the supply rate of the polishing liquid indicates an amount of the polishing liquid (ml) to be supplied every minute for 1 $cm^2$ of a surface to be polished during polishing.

<Cleaning Step>

It is also preferable that the present CMP method has a cleaning step of cleaning the obtained object to be polished, which has been polished, after the step of obtaining the object to be polished, which has been polished.

The residues on the surface to be polished can be removed by the cleaning step.

The cleaning liquid used in the cleaning step is not limited, and examples thereof include a cleaning liquid that is alkaline (alkaline cleaning liquid), a cleaning liquid that is acidic (acidic cleaning liquid), water, and an organic solvent-based solution, and the alkaline cleaning liquid is preferable. The cleaning step may be performed twice or more using different cleaning liquids.

The organic solvent-based solution is a solution including an organic solvent, and may be mixed with a component (for example, water) other than the organic solvent. Examples of the organic solvent in the organic solvent-based solution include ketone-based solvents, ether-based solvents, alcohol-based solvents, glycol-based solvents, glycol ether-based solvents, and amide-based solvents, and the like, and more specifically isopropyl alcohol. A content of the organic solvent in the organic solvent-based solution is preferably more than 50% by mass and 100% by mass or less, more preferably 80% to 100% by mass, and still more preferably 99% to 100% by mass.

In addition, after the cleaning step, a post-cleaning step for removing the cleaning liquid adhering to the object to be polished, which has been polished, may be further carried out. Specific embodiments of the post-cleaning step in the present step include a method of further cleaning the object to be polished, which has been polished, after the cleaning step with a post-cleaning liquid such as an organic solvent-based solution and water.

The organic solvent-based solution is as explained in the description of the cleaning liquid.

In a case where the cleaning with an organic solvent-based solution is performed at least once through the cleaning step and the post-cleaning step, organic-based residues (particularly organic-based non-particulate residues) on the surface to be polished are easily removed.

EXAMPLES

Hereinbelow, the present invention will be described in more detail with reference to Examples. The materials, the amounts of materials used, the proportions, the treatment details, the treatment procedure, or the like shown in the Examples below may be modified as appropriate as long as the modifications do not depart from the spirit of the present invention. Therefore, the scope of the present invention should not be construed as being limited to Examples shown below. In addition, "%" means "% by mass" unless otherwise specified.

Example A

[Preparation of Polishing Liquid]

<Raw Materials>

Polishing liquids shown in Table 1 below were prepared using the following raw materials.

(Colloidal Silica)

PL1 (product name, manufactured by Fuso Chemical Co., Ltd., colloidal silica, average primary particle diameter of 15 nm, degree of association of 2.7)

(Passivation Film Forming Agent)

Salicylic acid
4-Methylsalicylic acid
Anthranilic acid
4-Methylbenzoic acid
4-tert-Butylbenzoic acid
4-Propylbenzoic acid
4-Pentyl benzoic acid
6-Hydroxy-2-naphthalenecarboxylic acid
1-Hydroxy-2-naphthalenecarboxylic acid
3-Hydroxy-2-naphthalenecarboxylic acid
Quinaldic acid
8-Hydroxyquinoline
2-Methyl-8-hydroxyquinoline (Polymer Compound)

Polyacrylic acid (MAA, weight-average molecular weight is as shown in the table below)

(Hydrogen Peroxide)

Hydrogen peroxide (Cationic Compound)

Tetrapropylphosphonium Hydroxide (TPPH)
Tetrabutylphosphonium Hydroxide (TBPH)
Tetrabutylammonium hydroxide (TBAH)
Tetramethylammonium hydroxide (TMAH)
Choline (2-hydroxyethyltrimethylammonium hydroxide)

(Benzotriazole Compound)

Benzotriazole (BTA)
5-Methyl-1H-benzotriazole (5-MBTA)
1-Hydroxybenzotriazole (1-HBTA)

(Organic Acid)

Malonic acid
Malic acid
Citric acid (CA)
1-Hydroxyethane-1,1-diphosphonic acid (HEDP)
Ethylenediaminetetramethylenephosphonic acid (EDTPO)

(Organic Solvent)

3-Methoxy-3-methylbutanol (MMB)

(Anionic Surfactant)

N-Lauroyl sarcosinate (N-LSAR)
Dodecylbenzenesulfonic acid (DBSA)
Lauryl phosphonic acid (LPA)
Lauryl diphenyl ether disulfonic acid (LAPhEDSA)

(Nonionic Surfactant)

Surfinol 465 (manufactured by Nissin Chemical Co., Ltd.)

Surfinol 61 (manufactured by Nissin Chemical Co., Ltd.)

Surfinol 485 (manufactured by Nissin Chemical Co., Ltd.)

(pH Adjuster)

Sulfuric acid ($H_2SO_4$)

Aqueous ammonia (Water)

Water (Ultrapure water)

<Preparation of Polishing Liquid>

The respective raw materials (or aqueous solutions thereof) were mixed to prepare the polishing liquid of each of Examples or Comparative Examples shown in Table 1 below.

The components of the produced polishing liquid are shown in the tables below.

The "Amount" column in the tables indicates the content of each component with respect to the total mass of the polishing liquid.

The description of "%" indicates "% by mass" respectively.

The content of each component in the tables indicates a content of each component as a compound. For example, hydrogen peroxide was added in the state of an aqueous hydrogen peroxide solution in the preparation of the polishing liquid, but the description of the content in the "Hydrogen peroxide" column in the tables indicates a content of hydrogen peroxide ($H_2O_2$) itself included in the polishing liquid, not that of the aqueous hydrogen peroxide solution added to the polishing liquid.

The content of the colloidal silica indicates a content of the silica colloidal particles themselves included in the polishing liquid.

The description of "Adjusted" as the content of the pH adjuster indicates that either $H_2SO_4$ or aqueous ammonia is added in an amount so that the pH of a polishing liquid thus finally obtained is a value shown in the "pH" column.

The description of "Balance" as the amount of water to be added indicates that the component other than the components shown in the tables in the polishing liquid is water.

The "Ratio 1" column shows a mass ratio (content of the passivation film forming agent/content of the polymer compound) of the content of the passivation film forming agent to the content of the polymer compound in the polishing liquid.

The "Ratio 2" column shows a mass ratio (content of the passivation film forming agent/content of the benzotriazole compound) of the content of the passivation film forming agent to the content of the benzotriazole compound in the polishing liquid.

The "Ratio 3" column shows a mass ratio (content of the passivation film forming agent/content of the cationic surfactant) of the content of the passivation film forming agent to the content of the cationic surfactant in the polishing liquid.

The "Ratio 4" column shows a mass ratio (content of the polymer compound/content of the cationic surfactant) of the content of the polymer compound to the content of the cationic surfactant in the polishing liquid.

The "HLB" column shows an HLB value of the nonionic surfactant.

The "ζ Potential" column shows a zeta potential of colloidal silica as measured in the state where the colloidal silica are present in the polishing liquid.

In Table 1-1a, Table 1-1b, Table 1-1c, and Table 1-1d, the contents and the characteristics of the respective components in the same polishing liquid are divided and described. For example, the polishing liquid of Example 1 includes 2.0% by mass of PL1 as colloidal silica, 0.2% by mass of salicylic acid as a passivation film forming agent having a C log P value of 2.06, 0.1% by mass of a polyacrylic acid (PAA) having a weight-average molecular weight of 25,000 as a polymer compound, 0.1% by mass of hydrogen peroxide, and a pH adjuster in an amount that brings the pH of the final polishing liquid to 3.0 as a whole, and the residual component is water. In addition, the ratio 1 of the polishing liquid of Example 1 is 2.0, and the potential is 12.4 mV.

The same applies to "Table 1-2a, Table 1-2b, Table 1-2c, and Table 1-2d" and "Table 1-3a, Table 1-3b, Table 1-3c, and Table 1-3d".

TABLE 1

| | Colloidal silica | | Passivation film forming agent | | | Polymer compound | | |
|---|---|---|---|---|---|---|---|---|
| Table 1-1a | Type | Amount (%) | Type | ClogP | Amount (%) | Type | Molecular weight | Amount (%) |
| Example 1 | PL1 | 2.0 | Salicylic acid | 2.06 | 0.2 | PAA | 25,000 | 0.1 |
| Example 2 | PL1 | 2.0 | 4-Methylsalicylic acid | 2.52 | 0.2 | PAA | 25,000 | 0.1 |
| Example 3 | PL1 | 2.0 | 4-Methylbenzoic acid | 2.36 | 0.2 | PAA | 25,000 | 0.1 |
| Example 4 | PL1 | 2.0 | 4-tert-Butylbenzoic acid | 3.58 | 0.2 | PAA | 25,000 | 0.1 |
| Example 5 | PL1 | 2.0 | 4-Propylbenzoic acid | 3.42 | 0.2 | PAA | 25,000 | 0.1 |
| Example 6 | PL1 | 2.0 | 6-Hydroxy-2-naphthalenecarboxylic acid | 2.39 | 0.2 | PAA | 25,000 | 0.1 |
| Example 7 | PL1 | 2.0 | 1-Hydroxy-2-naphthalenecarboxylic acid | 3.29 | 0.2 | PAA | 25,000 | 0.1 |
| Example 8 | PL1 | 2.0 | 3-Hydroxy-2-naphthalenecarboxylic acid | 3.29 | 0.2 | PAA | 25,000 | 0.1 |
| Example 9 | PL1 | 2.0 | Quinaldic acid | 2.17 | 0.2 | PAA | 25,000 | 0.1 |
| Example 10 | PL1 | 2.0 | 8-Hydroxyquinoline | 1.87 | 0.2 | PAA | 25,000 | 0.1 |
| Example 11 | PL1 | 2.0 | 2-Methyl-8-hydroxyquinoline | 2.33 | 0.2 | PAA | 25,000 | 0.1 |
| Example 12 | PL1 | 2.0 | 4-Methylbenzoic acid | 2.36 | 0.2 | PAA | 25,000 | 0.1 |
| Example 13 | PL1 | 2.0 | 4-Methylbenzoic acid | 2.36 | 0.2 | PAA | 25,000 | 0.1 |
| Example 14 | PL1 | 2.0 | 4-Methylbenzoic acid | 2.36 | 0.2 | PAA | 25,000 | 0.1 |
| Example 15 | PL1 | 2.0 | 4-Methylbenzoic acid | 2.36 | 0.2 | PAA | 25,000 | 0.1 |
| Example 16 | PL1 | 2.0 | 4-Methylbenzoic acid | 2.36 | 0.2 | PAA | 25,000 | 0.1 |
| Example 17 | PL1 | 2.0 | 4-Methylbenzoic acid | 2.36 | 0.2 | PAA | 25,000 | 0.1 |
| Example 18 | PL1 | 2.0 | 4-Methylbenzoic acid | 2.36 | 0.2 | PAA | 25,000 | 0.1 |
| Example 19 | PL1 | 2.0 | 4-Methylbenzoic acid | 2.36 | 0.2 | PAA | 25,000 | 0.1 |

TABLE 1-continued

| | Colloidal silica | | Passivation film forming agent | | | Polymer compound | | |
|---|---|---|---|---|---|---|---|---|
| Table 1-1a | Type | Amount (%) | Type | ClogP | Amount (%) | Type | Molecular weight | Amount (%) |
| Example 20 | PL1 | 2.0 | 4-Methylsalicylic acid | 2.52 | 0.2 | PAA | 25,000 | 0.1 |
| Example 21 | PL1 | 2.0 | 4-Methylbenzoic acid | 2.36 | 0.2 | PAA | 25,000 | 0.1 |
| Example 22 | PL1 | 2.0 | 4-tert-Butylbenzoic acid | 3.58 | 0.2 | PAA | 25,000 | 0.1 |
| Example 23 | PL1 | 2.0 | 4-Propylbenzoic acid | 3.42 | 0.2 | PAA | 25,000 | 0.1 |
| Example 24 | PL1 | 2.0 | 6-Hydroxy-2-naphthalenecarboxylic acid | 2.39 | 0.2 | PAA | 25,000 | 0.1 |
| Example 25 | PL1 | 2.0 | 1-Hydroxy-2-naphthalenecarboxylic acid | 3.29 | 0.2 | PAA | 25,000 | 0.1 |
| Example 26 | PL1 | 2.0 | 3-Hydroxy-2-naphthalenecarboxylic acid | 3.29 | 0.2 | PAA | 25,000 | 0.1 |
| Example 27 | PL1 | 2.0 | Salicylic acid | 2.06 | 0.2 | PAA | 25,000 | 0.1 |
| Example 28 | PL1 | 2.0 | 4-Methylsalicylic acid | 2.52 | 0.2 | PAA | 25,000 | 0.1 |
| Example 29 | PL1 | 2.0 | 4-Methylbenzoic acid | 2.36 | 0.2 | PAA | 25,000 | 0.1 |
| Example 30 | PL1 | 2.0 | 4-tert-Butylbenzoic acid | 3.58 | 0.2 | PAA | 25,000 | 0.1 |

TABLE 2

| | Hydrogen peroxide | Cationic compound | | Organic acid | | Organic solvent | | Benzotriazole compound | |
|---|---|---|---|---|---|---|---|---|---|
| Table 1-1b | Amount (%) | Type | Amount (%) | Type | Amount (%) | Type | Amount (%) | Type | Amount (%) |
| Example 1 | 0.1 | | | z | z | | | | |
| Example 2 | 0.1 | | | | | | | | |
| Example 3 | 0.1 | | | | | | | | |
| Example 4 | 0.1 | | | | | | | | |
| Example 5 | 0.1 | | | | | | | | |
| Example 6 | 0.1 | | | | | | | | |
| Example 7 | 0.1 | | | | | | | | |
| Example 8 | 0.1 | | | | | | | | |
| Example 9 | 0.1 | | | | | | | | |
| Example 10 | 0.1 | | | | | | | | |
| Example 11 | 0.1 | | | | | | | | |
| Example 12 | 0.1 | TPPH | 0.1 | | | MMB | 0.5 | | |
| Example 13 | 0.1 | TPPH | 0.5 | | | MMB | 0.5 | | |
| Example 14 | 0.1 | TPPH | 3.0 | | | MMB | 0.5 | | |
| Example 15 | 0.1 | TBPH | 0.5 | | | MMB | 0.5 | | |
| Example 16 | 0.1 | TBAH | 0.5 | | | MMB | 0.5 | | |
| Example 17 | 0.1 | TMAH | 0.5 | | | MMB | 0.5 | | |
| Example 18 | 0.1 | Choline | 0.5 | | | MMB | 0.5 | | |
| Example 19 | 0.1 | TBAH | 0.5 | | | MMB | 0.5 | BTA | 0.05 |
| Example 20 | 0.1 | TBAH | 0.5 | | | MMB | 0.5 | BTA | 0.05 |
| Example 21 | 0.1 | TBAH | 0.5 | | | MMB | 0.5 | BTA | 0.05 |
| Example 22 | 0.1 | TBAH | 0.5 | | | MMB | 0.5 | BTA | 0.05 |
| Example 23 | 0.1 | TBAH | 0.5 | | | MMB | 0.5 | BTA | 0.05 |
| Example 24 | 0.1 | TBAH | 0.5 | | | MMB | 0.5 | BTA | 0.05 |
| Example 25 | 0.1 | TBAH | 0.5 | | | MMB | 0.5 | BTA | 0.05 |
| Example 26 | 0.1 | TBAH | 0.5 | | | MMB | 0.5 | BTA | 0.05 |
| Example 27 | 0.1 | TBAH | 0.5 | | | MMB | 0.5 | 5-MBTA | 0.05 |
| Example 28 | 0.1 | TBAH | 0.5 | | | MMB | 0.5 | 5-MBTA | 0.05 |
| Example 29 | 0.1 | TBAH | 0.5 | | | MMB | 0.5 | 5-MBTA | 0.05 |
| Example 30 | 0.1 | TBAH | 0.5 | | | MMB | 0.5 | 5-MBTA | 0.05 |

TABLE 3

| | Anionic surfactant | | Nonionic surfactant | | | | | |
|---|---|---|---|---|---|---|---|---|
| Table 1-1c | Type | Amount (%) | Type | HLB | Amount (%) | pH Adjuster Amount | pH | Water Content |
| Example 1 | z | z | z | z | z | Adjusted | 3.0 | Balance |
| Example 2 | | | | | | Adjusted | 3.0 | Balance |
| Example 3 | | | | | | Adjusted | 3.0 | Balance |
| Example 4 | | | | | | Adjusted | 3.0 | Balance |
| Example 5 | | | | | | Adjusted | 3.0 | Balance |
| Example 6 | | | | | | Adjusted | 3.0 | Balance |
| Example 7 | | | | | | Adjusted | 3.0 | Balance |
| Example 8 | | | | | | Adjusted | 3.0 | Balance |
| Example 9 | | | | | | Adjusted | 3.0 | Balance |

TABLE 3-continued

| | Anionic surfactant | | Nonionic surfactant | | | | | |
|---|---|---|---|---|---|---|---|---|
| Table 1-1c | Type | Amount (%) | Type | HLB | Amount (%) | pH Adjuster Amount | pH | Water Content |
| Example 10 | | | | | | Adjusted | 3.0 | Balance |
| Example 11 | | | | | | Adjusted | 3.0 | Balance |
| Example 12 | | | | | | Adjusted | 3.0 | Balance |
| Example 13 | | | | | | Adjusted | 3.0 | Balance |
| Example 14 | | | | | | Adjusted | 3.0 | Balance |
| Example 15 | | | | | | Adjusted | 3.0 | Balance |
| Example 16 | | | | | | Adjusted | 3.0 | Balance |
| Example 17 | | | | | | Adjusted | 3.0 | Balance |
| Example 18 | | | | | | Adjusted | 3.0 | Balance |
| Example 19 | | | | | | Adjusted | 3.0 | Balance |
| Example 20 | | | | | | Adjusted | 3.0 | Balance |
| Example 21 | | | | | | Adjusted | 3.0 | Balance |
| Example 22 | | | | | | Adjusted | 3.0 | Balance |
| Example 23 | | | | | | Adjusted | 3.0 | Balance |
| Example 24 | | | | | | Adjusted | 3.0 | Balance |
| Example 25 | | | | | | Adjusted | 3.0 | Balance |
| Example 26 | | | | | | Adjusted | 3.0 | Balance |
| Example 27 | | | | | | Adjusted | 3.0 | Balance |
| Example 28 | | | | | | Adjusted | 3.0 | Balance |
| Example 29 | | | | | | Adjusted | 3.0 | Balance |
| Example 30 | | | | | | Adjusted | 3.0 | Balance |

TABLE 4

| Table 1-1d | Ratio 1 | Ratio 2 | Ratio 3 | Ratio 4 | ζ Potential (mV) |
|---|---|---|---|---|---|
| Example 1 | 2.0 | | | | 12.4 |
| Example 2 | 2.0 | | | | 15.1 |
| Example 3 | 2.0 | | | | 14.2 |
| Example 4 | 2.0 | | | | 19.2 |
| Example 5 | 2.0 | | | | 16.2 |
| Example 6 | 2.0 | | | | 14.3 |
| Example 7 | 2.0 | | | | 19.7 |
| Example 8 | 2.0 | | | | 19.7 |
| Example 9 | 2.0 | | | | 13.0 |
| Example 10 | 2.0 | | | | 11.2 |
| Example 11 | 2.0 | | | | 14.0 |
| Example 12 | 2.0 | | 2.00 | 1.00 | 24.2 |
| Example 13 | 2.0 | | 0.40 | 0.20 | 26.2 |
| Example 14 | 2.0 | | 0.07 | 0.03 | 28.9 |
| Example 15 | 2.0 | | 0.40 | 0.20 | 28.2 |
| Example 16 | 2.0 | | 0.40 | 0.20 | 26.2 |

TABLE 4-continued

| Table 1-1d | Ratio 1 | Ratio 2 | Ratio 3 | Ratio 4 | ζ Potential (mV) |
|---|---|---|---|---|---|
| Example 17 | 2.0 | | 0.40 | 0.20 | 22.2 |
| Example 18 | 2.0 | | 0.40 | 0.20 | 20.2 |
| Example 19 | 2.0 | 4.0 | 0.40 | 0.20 | 24.6 |
| Example 20 | 2.0 | 4.0 | 0.40 | 0.20 | 25.7 |
| Example 21 | 2.0 | 4.0 | 0.40 | 0.20 | 25.0 |
| Example 22 | 2.0 | 4.0 | 0.40 | 0.20 | 32.3 |
| Example 23 | 2.0 | 4.0 | 0.40 | 0.20 | 31.4 |
| Example 24 | 2.0 | 4.0 | 0.40 | 0.20 | 25.2 |
| Example 25 | 2.0 | 4.0 | 0.40 | 0.20 | 30.2 |
| Example 26 | 2.0 | 4.0 | 0.40 | 0.20 | 30.2 |
| Example 27 | 2.0 | 4.0 | 0.40 | 0.20 | 22.8 |
| Example 28 | 2.0 | 4.0 | 0.40 | 0.20 | 25.7 |
| Example 29 | 2.0 | 4.0 | 0.40 | 0.20 | 25.0 |
| Example 30 | 2.0 | 4.0 | 0.40 | 0.20 | 32.3 |

TABLE 5

| | Colloidal silica | | Passivation film forming agent | | | Polymer compound | | |
|---|---|---|---|---|---|---|---|---|
| Table 1-2a | Type | Amount (%) | Type | ClogP | Amount (%) | Type | Molecular weight | Amount (%) |
| Example 31 | PL1 | 2.0 | 4-Propylbenzoic acid | 3.42 | 0.2 | PAA | 25,000 | 0.1 |
| Example 32 | PL1 | 2.0 | 6-Hydroxy-2-naphthalenecarboxylic acid | 2.39 | 0.2 | PAA | 25,000 | 0.1 |
| Example 33 | PL1 | 2.0 | 1-Hydroxy-2-naphthalenecarboxylic acid | 3.29 | 0.2 | PAA | 25,000 | 0.1 |
| Example 34 | PL1 | 2.0 | 3-Hydroxy-2-naphthalenecarboxylic acid | 3.29 | 0.2 | PAA | 25,000 | 0.1 |
| Example 35 | PL1 | 2.0 | Salicylic acid | 2.06 | 0.2 | PAA | 25,000 | 0.1 |
| Example 36 | PL1 | 2.0 | 4-Methylsalicylic acid | 2.52 | 0.2 | PAA | 25,000 | 0.1 |
| Example 37 | PL1 | 2.0 | 4-Methylbenzoic acid | 2.36 | 0.2 | PAA | 25,000 | 0.1 |
| Example 38 | PL1 | 2.0 | 4-tert-Butylbenzoic acid | 3.58 | 0.2 | PAA | 25,000 | 0.1 |
| Example 39 | PL1 | 2.0 | 4-Propylbenzoic acid | 3.42 | 0.2 | PAA | 25,000 | 0.1 |
| Example 40 | PL1 | 2.0 | 6-Hydroxy-2-naphthalenecarboxylic acid | 2.39 | 0.2 | PAA | 25,000 | 0.1 |
| Example 41 | PL1 | 2.0 | 1-Hydroxy-2-naphthalenecarboxylic acid | 3.29 | 0.2 | PAA | 25,000 | 0.1 |
| Example 42 | PL1 | 2.0 | 3-Hydroxy-2-naphthalenecarboxylic acid | 3.29 | 0.2 | PAA | 25,000 | 0.1 |
| Example 43 | PL1 | 2.0 | Salicylic acid | 2.06 | 0.2 | PAA | 25,000 | 0.1 |
| Example 44 | PL1 | 2.0 | 4-Methylsalicylic acid | 2.52 | 0.2 | PAA | 25,000 | 0.1 |
| Example 45 | PL1 | 2.0 | 4-Methylbenzoic acid | 2.36 | 0.2 | PAA | 25,000 | 0.1 |
| Example 46 | PL1 | 2.0 | 4-tert-Butylbenzoic acid | 3.58 | 0.2 | PAA | 25,000 | 0.1 |
| Example 47 | PL1 | 2.0 | 4-Propylbenzoic acid | 3.42 | 0.2 | PAA | 25,000 | 0.1 |
| Example 48 | PL1 | 2.0 | 6-Hydroxy-2-naphthalenecarboxylic acid | 2.39 | 0.2 | PAA | 25,000 | 0.1 |
| Example 49 | PL1 | 2.0 | 1-Hydroxy-2-naphthalenecarboxylic acid | 3.29 | 0.2 | PAA | 25,000 | 0.1 |
| Example 50 | PL1 | 2.0 | 3-Hydroxy-2-naphthalenecarboxylic acid | 3.29 | 0.2 | PAA | 25,000 | 0.1 |

TABLE 5-continued

| Table 1-2a | Colloidal silica | | Passivation film forming agent | | | Polymer compound | | |
|---|---|---|---|---|---|---|---|---|
| | Type | Amount (%) | Type | ClogP | Amount (%) | Type | Molecular weight | Amount (%) |
| Example 51 | PL1 | 2.0 | Salicylic acid | 2.06 | 0.2 | PAA | 25,000 | 0.1 |
| Example 52 | PL1 | 2.0 | 4-Methylsalicylic acid | 2.52 | 0.2 | PAA | 25,000 | 0.1 |
| Example 53 | PL1 | 2.0 | 4-Methylbenzoic acid | 2.36 | 0.2 | PAA | 25,000 | 0.1 |
| Example 54 | PL1 | 2.0 | 4-tert-Butylbenzoic acid | 3.58 | 0.2 | PAA | 25,000 | 0.1 |
| Example 55 | PL1 | 2.0 | 4-Propylbenzoic acid | 3.42 | 0.2 | PAA | 25,000 | 0.1 |
| Example 56 | PL1 | 2.0 | 6-Hydroxy-2-naphthalenecarboxylic acid | 2.39 | 0.2 | PAA | 25,000 | 0.1 |
| Example 57 | PL1 | 2.0 | 1-Hydroxy-2-naphthalenecarboxylic acid | 3.29 | 0.2 | PAA | 25,000 | 0.1 |
| Example 58 | PL1 | 2.0 | 3-Hydroxy-2-naphthalenecarboxylic acid | 3.29 | 0.2 | PAA | 25,000 | 0.1 |
| Example 59 | PL1 | 2.0 | 4-Methylbenzoic acid | 2.36 | 0.2 | PAA | 25,000 | 0.1 |
| Example 60 | PL1 | 2.0 | 4-Methylbenzoic acid | 2.36 | 0.2 | PAA | 25,000 | 0.1 |

TABLE 6

| Table 1-2b | Hydrogen peroxide | Cationic compound | | Organic acid | | Organic solvent | | Benzotriazole compound | |
|---|---|---|---|---|---|---|---|---|---|
| | Amount (%) | Type | Amount (%) | Type | Amount (%) | Type | Amount (%) | Type | Amount (%) |
| Example 31 | 0.1 | TBAH | 0.5 | z | z | MMB | 0.5 | 5-MBTA | 0.05 |
| Example 32 | 0.1 | TBAH | 0.5 | | | MMB | 0.5 | 5-MBTA | 0.05 |
| Example 33 | 0.1 | TBAH | 0.5 | | | MMB | 0.5 | 5-MBTA | 0.05 |
| Example 34 | 0.1 | TBAH | 0.5 | | | MMB | 0.5 | 5-MBTA | 0.05 |
| Example 35 | 0.1 | TBAH | 0.5 | | | MMB | 0.5 | 1-HBTA | 0.10 |
| Example 36 | 0.1 | TBAH | 0.5 | | | MMB | 0.5 | 1-HBTA | 0.10 |
| Example 37 | 0.1 | TBAH | 0.5 | | | MMB | 0.5 | 1-HBTA | 0.10 |
| Example 38 | 0.1 | TBAH | 0.5 | | | MMB | 0.5 | 1-HBTA | 0.10 |
| Example 39 | 0.1 | TBAH | 0.5 | | | MMB | 0.5 | 1-HBTA | 0.10 |
| Example 40 | 0.1 | TBAH | 0.5 | | | MMB | 0.5 | 1-HBTA | 0.10 |
| Example 41 | 0.1 | TBAH | 0.5 | | | MMB | 0.5 | 1-HBTA | 0.10 |
| Example 42 | 0.1 | TBAH | 0.5 | | | MMB | 0.5 | 1-HBTA | 0.10 |
| Example 43 | 0.1 | TBAH | 0.5 | | | MMB | 0.5 | 5-MBTA | 0.05 |
| | | | | | | | | 1-HBTA | 0.10 |
| Example 44 | 0.1 | TBAH | 0.5 | | | MMB | 0.5 | 5-MBTA | 0.05 |
| | | | | | | | | 1-HBTA | 0.10 |
| Example 45 | 0.1 | TBAH | 0.5 | | | MMB | 0.5 | 5-MBTA | 0.05 |
| | | | | | | | | 1-HBTA | 0.10 |
| Example 46 | 0.1 | TBAH | 0.5 | | | MMB | 0.5 | 5-MBTA | 0.05 |
| | | | | | | | | 1-HBTA | 0.10 |
| Example 47 | 0.1 | TBAH | 0.5 | | | MMB | 0.5 | 5-MBTA | 0.05 |
| | | | | | | | | 1-HBTA | 0.10 |
| Example 48 | 0.1 | TBAH | 0.5 | | | MMB | 0.5 | 5-MBTA | 0.05 |
| | | | | | | | | 1-HBTA | 0.10 |
| Example 49 | 0.1 | TBAH | 0.5 | | | MMB | 0.5 | 5-MBTA | 0.05 |
| | | | | | | | | 1-HBTA | 0.10 |
| Example 50 | 0.1 | TBAH | 0.5 | | | MMB | 0.5 | 5-MBTA | 0.05 |
| | | | | | | | | 1-HBTA | 0.10 |
| Example 51 | 0.1 | TBAH | 0.5 | | | MMB | 0.5 | 1-HBTA | 0.10 |
| Example 52 | 0.1 | TBAH | 0.5 | | | MMB | 0.5 | 1-HBTA | 0.10 |
| Example 53 | 0.1 | TBAH | 0.5 | | | MMB | 0.5 | 1-HBTA | 0.10 |
| Example 54 | 0.1 | TBAH | 0.5 | | | MMB | 0.5 | 1-HBTA | 0.10 |
| Example 55 | 0.1 | TBAH | 0.5 | | | MMB | 0.5 | 1-HBTA | 0.10 |
| Example 56 | 0.1 | TBAH | 0.5 | | | MMB | 0.5 | 1-HBTA | 0.10 |
| Example 57 | 0.1 | TBAH | 0.5 | | | MMB | 0.5 | 1-HBTA | 0.10 |
| Example 58 | 0.1 | TBAH | 0.5 | | | MMB | 0.5 | 1-HBTA | 0.10 |
| Example 59 | 0.1 | TBAH | 0.5 | | | MMB | 0.5 | 1-HBTA | 0.10 |
| Example 60 | 0.1 | TBAH | 0.5 | | | MMB | 0.5 | 1-HBTA | 0.10 |

TABLE 7

| Table 1-2b | Anionic surfactant Type | Anionic surfactant Amount (%) | Nonionic surfactant Type | Nonionic surfactant HLB | Nonionic surfactant Amount (%) | pH Adjuster Amount | pH | Water Content |
|---|---|---|---|---|---|---|---|---|
| Example 31 | | | z | z | z | Adjusted | 3.0 | Balance |
| Example 32 | | | | | | Adjusted | 3.0 | Balance |
| Example 33 | | | | | | Adjusted | 3.0 | Balance |
| Example 34 | | | | | | Adjusted | 3.0 | Balance |
| Example 35 | | | | | | Adjusted | 3.0 | Balance |
| Example 36 | | | | | | Adjusted | 3.0 | Balance |
| Example 37 | | | | | | Adjusted | 3.0 | Balance |
| Example 38 | | | | | | Adjusted | 3.0 | Balance |
| Example 39 | | | | | | Adjusted | 3.0 | Balance |
| Example 40 | | | | | | Adjusted | 3.0 | Balance |
| Example 41 | | | | | | Adjusted | 3.0 | Balance |
| Example 42 | | | | | | Adjusted | 3.0 | Balance |
| Example 43 | | | | | | Adjusted | 3.0 | Balance |
| Example 44 | | | | | | Adjusted | 3.0 | Balance |
| Example 45 | | | | | | Adjusted | 3.0 | Balance |
| Example 46 | | | | | | Adjusted | 3.0 | Balance |
| Example 47 | | | | | | Adjusted | 3.0 | Balance |
| Example 48 | | | | | | Adjusted | 3.0 | Balance |
| Example 49 | | | | | | Adjusted | 3.0 | Balance |
| Example 50 | | | | | | Adjusted | 3.0 | Balance |
| Example 51 | N-LSAR | 0.01 | | | | Adjusted | 3.0 | Balance |
| Example 52 | N-LSAR | 0.01 | | | | Adjusted | 3.0 | Balance |
| Example 53 | N-LSAR | 0.01 | | | | Adjusted | 3.0 | Balance |
| Example 54 | N-LSAR | 0.01 | | | | Adjusted | 3.0 | Balance |
| Example 55 | N-LSAR | 0.01 | | | | Adjusted | 3.0 | Balance |
| Example 56 | N-LSAR | 0.01 | | | | Adjusted | 3.0 | Balance |
| Example 57 | N-LSAR | 0.01 | | | | Adjusted | 3.0 | Balance |
| Example 58 | N-LSAR | 0.01 | | | | Adjusted | 3.0 | Balance |
| Example 59 | DBSA | 0.01 | | | | Adjusted | 3.0 | Balance |
| Example 60 | LPA | 0.01 | | | | Adjusted | 3.0 | Balance |

TABLE 8

| Table 1-2d | Ratio 1 | Ratio 2 | Ratio 3 | Ratio 4 | ζ Potential (mV) |
|---|---|---|---|---|---|
| Example 31 | 2.0 | 4.0 | 0.40 | 0.20 | 31.4 |
| Example 32 | 2.0 | 4.0 | 0.40 | 0.20 | 25.2 |
| Example 33 | 2.0 | 4.0 | 0.40 | 0.20 | 30.2 |
| Example 34 | 2.0 | 4.0 | 0.40 | 0.20 | 30.2 |
| Example 35 | 2.0 | 2.0 | 0.40 | 0.20 | 22.8 |
| Example 36 | 2.0 | 2.0 | 0.40 | 0.20 | 25.7 |
| Example 37 | 2.0 | 2.0 | 0.40 | 0.20 | 25.0 |
| Example 38 | 2.0 | 2.0 | 0.40 | 0.20 | 32.3 |
| Example 39 | 2.0 | 2.0 | 0.40 | 0.20 | 31.4 |
| Example 40 | 2.0 | 2.0 | 0.40 | 0.20 | 25.2 |
| Example 41 | 2.0 | 2.0 | 0.40 | 0.20 | 30.2 |
| Example 42 | 2.0 | 2.0 | 0.40 | 0.20 | 30.2 |
| Example 43 | 2.0 | 1.3 | 0.40 | 0.20 | 22.8 |
| Example 44 | 2.0 | 1.3 | 0.40 | 0.20 | 25.7 |
| Example 45 | 2.0 | 1.3 | 0.40 | 0.20 | 25.0 |
| Example 46 | 2.0 | 1.3 | 0.40 | 0.20 | 32.3 |

TABLE 8-continued

| Table 1-2d | Ratio 1 | Ratio 2 | Ratio 3 | Ratio 4 | ζ Potential (mV) |
|---|---|---|---|---|---|
| Example 47 | 2.0 | 1.3 | 0.40 | 0.20 | 31.4 |
| Example 48 | 2.0 | 1.3 | 0.40 | 0.20 | 25.2 |
| Example 49 | 2.0 | 1.3 | 0.40 | 0.20 | 30.2 |
| Example 50 | 2.0 | 1.3 | 0.40 | 0.20 | 30.3 |
| Example 51 | 2.0 | 2.0 | 0.40 | 0.20 | 22.9 |
| Example 52 | 2.0 | 2.0 | 0.40 | 0.20 | 25.7 |
| Example 53 | 2.0 | 2.0 | 0.40 | 0.20 | 24.8 |
| Example 54 | 2.0 | 2.0 | 0.40 | 0.20 | 32.2 |
| Example 55 | 2.0 | 2.0 | 0.40 | 0.20 | 31.6 |
| Example 56 | 2.0 | 2.0 | 0.40 | 0.20 | 24.9 |
| Example 57 | 2.0 | 2.0 | 0.40 | 0.20 | 30.2 |
| Example 58 | 2.0 | 2.0 | 0.40 | 0.20 | 30.4 |
| Example 59 | 2.0 | 2.0 | 0.40 | 0.20 | 24.8 |
| Example 60 | 2.0 | 2.0 | 0.40 | 0.20 | 24.8 |

TABLE 9

| Table 1-3a | Colloidal silica Type | Colloidal silica Amount (%) | Passivation film forming agent Type | Passivation film forming agent ClogP | Passivation film forming agent Amount (%) | Polymer compound Type | Polymer compound Molecular weight | Polymer compound Amount (%) |
|---|---|---|---|---|---|---|---|---|
| Example 61 | PL1 | 2.0 | 4-Methylbenzoic acid | 2.36 | 0.2 | PAA | 25,000 | 0.1 |
| Example 62 | PL1 | 1.0 | 4-Methylbenzoic acid | 2.36 | 0.2 | PAA | 25,000 | 0.1 |
| Example 63 | PL1 | 6.0 | 4-Methylbenzoic acid | 2.36 | 0.2 | PAA | 25,000 | 0.1 |
| Example 64 | PL1 | 2.0 | 4-Methylbenzoic acid | 2.36 | 0.2 | PAA | 25,000 | 0.1 |
| Example 65 | PL1 | 2.0 | 4-Methylbenzoic acid | 2.36 | 0.2 | PAA | 25,000 | 0.1 |
| Example 66 | PL1 | 2.0 | 4-Methylbenzoic acid | 2.36 | 0.2 | PAA | 25,000 | 0.1 |
| Example 67 | PL1 | 2.0 | 4-Methylbenzoic acid | 2.36 | 0.2 | PAA | 25,000 | 0.1 |
| Example 68 | PL1 | 2.0 | 4-Methylbenzoic acid | 2.36 | 0.2 | PAA | 25,000 | 0.1 |
| Example 69 | PL1 | 2.0 | 4-Methylbenzoic acid | 2.36 | 0.2 | PAA | 25,000 | 0.1 |
| Example 70 | PL1 | 2.0 | 4-Methylbenzoic acid | 2.36 | 0.001 | PAA | 25,000 | 0.1 |
| Example 71 | PL1 | 2.0 | 4-Methylbenzoic acid | 2.36 | 0.01 | PAA | 25,000 | 0.1 |

TABLE 9-continued

| Table 1-3a | Colloidal silica | | Passivation film forming agent | | | Polymer compound | | |
|---|---|---|---|---|---|---|---|---|
| | Type | Amount (%) | Type | ClogP | Amount (%) | Type | Molecular weight | Amount (%) |
| Example 72 | PL1 | 2.0 | 4-Methylbenzoic acid | 2.36 | 0.05 | PAA | 25,000 | 0.1 |
| Example 73 | PL1 | 2.0 | 4-Methylbenzoic acid | 2.36 | 0.1 | PAA | 25,000 | 0.1 |
| Example 74 | PL1 | 2.0 | 4-Methylbenzoic acid | 2.36 | 0.2 | PAA | 25,000 | 0.02 |
| Example 75 | PL1 | 2.0 | 4-Methylbenzoic acid | 2.36 | 0.2 | PAA | 25,000 | 0.5 |
| Example 76 | PL1 | 2.0 | 4-Methylbenzoic acid | 2.36 | 0.2 | PAA | 25,000 | 1.0 |
| Example 77 | PL1 | 2.0 | 4-Methylbenzoic acid | 2.36 | 0.2 | PAA | 25,000 | 5.0 |
| Example 78 | PL1 | 2.0 | 4-Methylbenzoic acid | 2.36 | 0.2 | PAA | 25,000 | 0.1 |
| Example 79 | PL1 | 2.0 | 4-Methylbenzoic acid | 2.36 | 0.2 | PAA | 25,000 | 0.1 |
| Example 80 | PL1 | 2.0 | 4-Methylbenzoic acid | 2.36 | 0.2 | PAA | 25,000 | 0.1 |
| Example 81 | PL1 | 2.0 | 4-Methylbenzoic acid | 2.36 | 0.2 | PAA | 25,000 | 0.1 |
| Example 82 | PL1 | 2.0 | 4-Methylbenzoic acid | 2.36 | 0.2 | PAA | 25,000 | 0.1 |
| Example 83 | PL1 | 2.0 | 4-Methylbenzoic acid | 2.36 | 0.2 | PAA | 25,000 | 0.1 |
| Example 84 | PL1 | 2.0 | 4-Methylbenzoic acid | 2.36 | 0.2 | PAA | 25,000 | 0.1 |
| Example 85 | PL1 | 2.0 | 4-Methylbenzoic acid | 2.36 | 0.2 | PAA | 25,000 | 0.1 |
| Example 86 | PL1 | 2.0 | 4-Methylbenzoic acid | 2.36 | 0.2 | PAA | 25,000 | 0.1 |
| Example 87 | PL1 | 2.0 | 4-Methylbenzoic acid | 2.36 | 0.2 | PAA | 500 | 0.1 |
| Example 88 | PL1 | 2.0 | 4-Methylbenzoic acid | 2.36 | 0.2 | PAA | 2,000 | 0.1 |
| Example 89 | PL1 | 2.0 | 4-Methylbenzoic acid | 2.36 | 0.2 | PAA | 5,000 | 0.1 |
| Example 90 | PL1 | 2.0 | 4-Methylbenzoic acid | 2.36 | 0.2 | PAA | 30,000 | 0.1 |
| Example 91 | PL1 | 2.0 | 4-Methylbenzoic acid | 2.36 | 0.2 | PAA | 50,000 | 0.1 |
| Comparative Example 1 | PL1 | 2.0 | | | | PAA | 25,000 | 0.1 |
| Comparative Example 2 | PL1 | 2.0 | Anthranilic acid | 1.21 | 0.2 | PAA | 25,000 | 0.1 |
| Comparative Example 2 | PL1 | 2.0 | 4-Pentylbenzoic acid | 4.48 | 0.2 | PAA | 25,000 | 0.1 |
| Comparative Example 3 | PL1 | 2.0 | 4-Methylbenzoic acid | 2.36 | 0.2 | | | |
| Comparative Example 4 | PL1 | 2.0 | 4-Methylbenzoic acid | 2.36 | 0.2 | PAA | 25,000 | 0.1 |
| Comparative Example 5 | PL1 | 2.0 | 4-Methylbenzoic acid | 2.36 | 0.2 | PAA | 25,000 | 0.1 |

TABLE 10

| Table 1-3b | Hydrogen peroxide | Cationic compound | | Organic acid | | Organic solvent | | Benzotriazole compound | |
|---|---|---|---|---|---|---|---|---|---|
| | Amount (%) | Type | Amount (%) | Type | Amount (%) | Type | Amount (%) | Type | Amount (%) |
| Example 61 | 0.1 | TBAH | 0.5 | | | MMB | 0.5 | 1-HBTA | 0.10 |
| Example 62 | 0.1 | TBAH | 0.5 | | | MMB | 0.5 | 1-HBTA | 0.10 |
| Example 63 | 0.1 | TBAH | 0.5 | | | MMB | 0.5 | 1-HBTA | 0.10 |
| Example 64 | 0.1 | TBAH | 0.5 | Malonic acid<br>CA | 0.3<br>0.3 | MMB | 0.5 | 1-HBTA | 0.10 |
| Example 65 | 0.1 | TBAH | 0.5 | HEDP | 0.1 | MMB | 0.5 | 1-HBTA | 0.10 |
| Example 66 | 0.1 | TBAH | 0.5 | Malic acid<br>EDTPO | 0.4<br>0.1 | MMB | 0.5 | 1-HBTA | 0.10 |
| Example 67 | 0.1 | TBAH | 0.5 | Malic acid | 0.5 | MMB | 0.5 | 1-HBTA | 0.10 |
| Example 68 | 0.1 | TBAH | 0.5 | Malic acid | 3.0 | MMB | 0.5 | 1-HBTA | 0.10 |
| Example 69 | 0.1 | TBAH | 0.5 | Malic acid | 5.0 | MMB | 0.5 | 1-HBTA | 0.10 |
| Example 70 | 0.1 | TBAH | 0.5 | | | MMB | 0.5 | 1-HBTA | 0.10 |
| Example 71 | 0.1 | TBAH | 0.5 | | | MMB | 0.5 | 1-HBTA | 0.10 |
| Example 72 | 0.1 | TBAH | 0.5 | | | MMB | 0.5 | 1-HBTA | 0.10 |
| Example 73 | 0.1 | TBAH | 0.5 | | | MMB | 0.5 | 1-HBTA | 0.10 |
| Example 74 | 0.1 | TBAH | 0.5 | | | MMB | 0.5 | 1-HBTA | 0.10 |
| Example 75 | 0.1 | TBAH | 0.5 | | | MMB | 0.5 | 1-HBTA | 0.10 |
| Example 76 | 0.1 | TBAH | 0.5 | | | MMB | 0.5 | 1-HBTA | 0.10 |
| Example 77 | 0.1 | TBAH | 0.5 | | | MMB | 0.5 | 1-HBTA | 0.10 |
| Example 78 | 0.1 | TBAH | 0.5 | | | MMB | 0.01 | 1-HBTA | 0.10 |
| Example 79 | 0.1 | TBAH | 0.5 | | | MMB | 0.1 | 1-HBTA | 0.10 |
| Example 80 | 0.1 | TBAH | 0.5 | | | MMB | 3.0 | 1-HBTA | 0.10 |
| Example 81 | 0.1 | TBAH | 0.5 | | | MMB | 0.5 | 1-HBTA | 0.10 |
| Example 82 | 0.1 | TBAH | 0.5 | | | MMB | 0.5 | 1-HBTA | 0.10 |
| Example 83 | 0.1 | TBAH | 0.5 | | | MMB | 0.5 | 1-HBTA | 0.10 |
| Example 84 | 0.1 | TBAH | 0.5 | | | MMB | 0.5 | 1-HBTA | 0.10 |
| Example 85 | 0.1 | TBAH | 0.5 | | | MMB | 0.5 | 1-HBTA | 0.10 |
| Example 86 | 0.1 | TBAH | 0.5 | | | MMB | 0.5 | 1-HBTA | 0.10 |
| Example 87 | 0.1 | TBAH | 0.5 | | | MMB | 0.5 | 1-HBTA | 0.10 |
| Example 88 | 0.1 | TBAH | 0.5 | | | MMB | 0.5 | 1-HBTA | 0.10 |
| Example 89 | 0.1 | TBAH | 0.5 | | | MMB | 0.5 | 1-HBTA | 0.10 |

TABLE 10-continued

| Table 1-3b | Hydrogen peroxide Amount (%) | Cationic compound Type | Cationic compound Amount (%) | Organic acid Type | Organic acid Amount (%) | Organic solvent Type | Organic solvent Amount (%) | Benzotriazole compound Type | Benzotriazole compound Amount (%) |
|---|---|---|---|---|---|---|---|---|---|
| Example 90 | 0.1 | TBAH | 0.5 | | | MMB | 0.5 | 1-HBTA | 0.10 |
| Example 91 | 0.1 | TBAH | 0.5 | | | MMB | 0.5 | 1-HBTA | 0.10 |
| Comparative Example 1 | 0.1 | | | | | MMB | 0.5 | 1-HBTA | 0.10 |
| Comparative Example 2 | 0.1 | | | | | MMB | 0.5 | 1-HBTA | 0.10 |
| Comparative Example 2 | 0.1 | | | | | MMB | 0.5 | 1-HBTA | 0.10 |
| Comparative Example 3 | 0.1 | | | | | MMB | 0.5 | 1-HBTA | 0.10 |
| Comparative Example 4 | 0.1 | | | | | MMB | 0.5 | 1-HBTA | 0.10 |
| Comparative Example 5 | 0.1 | | | | | MMB | 0.5 | 1-HBTA | 0.10 |

TABLE 11

| Table 1-3c | Anionic surfactant Type | Anionic surfactant Amount (%) | Nonionic surfactant Type | Nonionic surfactant HLB | Nonionic surfactant Amount (%) | pH Adjuster Amount | pH | Water Content |
|---|---|---|---|---|---|---|---|---|
| Example 61 | LAPhEDSA | 0.01 | | | | Adjusted | 3.0 | Balance |
| Example 62 | | | | | | Adjusted | 3.0 | Balance |
| Example 63 | | | | | | Adjusted | 3.0 | Balance |
| Example 64 | | | | | | Adjusted | 3.0 | Balance |
| Example 65 | | | | | | Adjusted | 3.0 | Balance |
| Example 66 | | | | | | Adjusted | 3.0 | Balance |
| Example 67 | | | | | | Adjusted | 3.0 | Balance |
| Example 68 | | | | | | Adjusted | 3.0 | Balance |
| Example 69 | | | | | | Adjusted | 3.0 | Balance |
| Example 70 | | | | | | Adjusted | 3.0 | Balance |
| Example 71 | | | | | | Adjusted | 3.0 | Balance |
| Example 72 | | | | | | Adjusted | 3.0 | Balance |
| Example 73 | | | | | | Adjusted | 3.0 | Balance |
| Example 74 | | | | | | Adjusted | 3.0 | Balance |
| Example 75 | | | | | | Adjusted | 3.0 | Balance |
| Example 76 | | | | | | Adjusted | 3.0 | Balance |
| Example 77 | | | | | | Adjusted | 3.0 | Balance |
| Example 78 | | | | | | Adjusted | 3.0 | Balance |
| Example 79 | | | | | | Adjusted | 3.0 | Balance |
| Example 80 | | | | | | Adjusted | 3.0 | Balance |
| Example 81 | | | Surfinol 465 | 13 | 0.005 | Adjusted | 2.0 | Balance |
| Example 82 | | | Surfinol 465 | 13 | 0.005 | Adjusted | 3.0 | Balance |
| Example 83 | | | Surfinol 465 | 13 | 0.005 | Adjusted | 3.5 | Balance |
| Example 84 | | | Surfinol 465 | 13 | 0.005 | Adjusted | 4.0 | Balance |
| Example 85 | | | Surfinol 61 | 6 | 0.005 | Adjusted | 3.0 | Balance |
| Example 86 | | | Surfinol 485 | 17 | 0.005 | Adjusted | 3.0 | Balance |
| Example 87 | | | | | | Adjusted | 3.0 | Balance |
| Example 88 | | | | | | Adjusted | 3.0 | Balance |
| Example 89 | | | | | | Adjusted | 3.0 | Balance |
| Example 90 | | | | | | Adjusted | 3.0 | Balance |
| Example 91 | | | | | | Adjusted | 3.0 | Balance |
| Comparative Example 1 | | | | | | Adjusted | 3.0 | Balance |
| Comparative Example 2 | | | | | | Adjusted | 3.0 | Balance |
| Comparative Example 2 | | | | | | Adjusted | 3.0 | Balance |
| Comparative Example 3 | | | | | | Adjusted | 3.0 | Balance |
| Comparative Example 4 | | | | | | Adjusted | 1.5 | Balance |
| Comparative Example 5 | | | | | | Adjusted | 5.0 | Balance |

TABLE 12

| Table 1-3d | Ratio 1 | Ratio 2 | Ratio 3 | Ratio 4 | ζ Potential (mV) |
|---|---|---|---|---|---|
| Example 61 | 2.0 | 2.0 | 0.40 | 0.20 | 24.8 |
| Example 62 | 2.0 | 2.0 | 0.40 | 0.20 | 25.1 |
| Example 63 | 2.0 | 2.0 | 0.40 | 0.20 | 25.2 |
| Example 64 | 2.0 | 2.0 | 0.40 | 0.20 | 24.6 |
| Example 65 | 2.0 | 2.0 | 0.40 | 0.20 | 24.7 |
| Example 66 | 2.0 | 2.0 | 0.40 | 0.20 | 24.8 |
| Example 67 | 2.0 | 2.0 | 0.40 | 0.20 | 24.9 |
| Example 68 | 2.0 | 2.0 | 0.40 | 0.20 | 24.5 |
| Example 69 | 2.0 | 2.0 | 0.40 | 0.20 | 24.5 |
| Example 70 | 0.01 | 0.01 | 0.002 | 0.20 | 24.5 |
| Example 71 | 0.1 | 0.1 | 0.02 | 0.20 | 24.6 |
| Example 72 | 0.5 | 0.5 | 0.10 | 0.20 | 24.6 |
| Example 73 | 1 | 1.0 | 0.20 | 0.20 | 24.7 |
| Example 74 | 10 | 2.0 | 0.40 | 0.04 | 25.2 |
| Example 75 | 0.4 | 2.0 | 0.40 | 1.00 | 25.2 |
| Example 76 | 0.2 | 2.0 | 0.40 | 2.00 | 25.1 |
| Example 77 | 0.04 | 2.0 | 0.40 | 10.00 | 24.8 |
| Example 78 | 2.0 | 2.0 | 0.40 | 0.20 | 25.1 |
| Example 79 | 2.0 | 2.0 | 0.40 | 0.20 | 24.9 |
| Example 80 | 2.0 | 2.0 | 0.40 | 0.20 | 24.8 |
| Example 81 | 2.0 | 2.0 | 0.40 | 0.20 | 25.2 |
| Example 82 | 2.0 | 2.0 | 0.40 | 0.20 | 24.7 |
| Example 83 | 2.0 | 2.0 | 0.40 | 0.20 | 25.1 |
| Example 84 | 2.0 | 2.0 | 0.40 | 0.20 | 24.9 |
| Example 85 | 2.0 | 2.0 | 0.40 | 0.20 | 24.9 |
| Example 86 | 2.0 | 2.0 | 0.40 | 0.20 | 24.8 |
| Example 87 | 2.0 | 2.0 | 0.40 | 0.20 | 24.7 |
| Example 88 | 2.0 | 2.0 | 0.40 | 0.20 | 25.1 |
| Example 89 | 2.0 | 2.0 | 0.40 | 0.20 | 24.9 |
| Example 90 | 2.0 | 2.0 | 0.40 | 0.20 | 24.8 |
| Example 91 | 2.0 | 2.0 | 0.40 | 0.20 | 25.1 |
| Comparative Example 1 | — | | | | |
| Comparative Example 2 | 2.0 | 2.0 | | | |
| Comparative Example 2 | 2.0 | 2.0 | | | |
| Comparative Example 3 | — | 2.0 | | | |
| Comparative Example 4 | 2.0 | 2.0 | | | |
| Comparative Example 5 | 2.0 | 2.0 | | | |

[Tests]

The following evaluations were each performed using the obtained polishing liquids.

<Evaluation of Dishing Suppressing Property>

A wafer was polished under the conditions that a polishing pressure was set to 2.0 psi and a supply rate of the polishing liquid was set to 0.28 ml/(min·cm$^2$), using FREX300SII (polishing device).

Incidentally, in the wafer, an interlayer insulating film consisting of silicon oxide was formed on a silicon substrate having a diameter of 12 inches (30.48 cm), and the interlayer insulating film was engraved with a groove having a line-and-space pattern consisting of a line of 10 μm and a space of 10 μm. A barrier layer (material: TiN, film thickness: 10 nm) was arranged along the shape of the groove, and the groove was filled with Co. Further, a bulk layer consisting of Co, having a film thickness of 150 to 300 nm, was formed on an upper part of a line-and-space part so that Co overflowed from the groove.

First, Co (bulk layer) of the non-wiring part was completely polished using CSL5250C (trade name, manufactured by FUJIFILM Planar Solutions, LLC) as a polishing liquid, and then polishing was further performed for 10 seconds. Thereafter, the wafer in which the barrier layer covered the interlayer insulating film was polished using the polishing liquid of each of Examples or Comparative Examples for 1 minute under the same conditions to remove the barrier layer on the interlayer insulating film.

A level difference (height difference) between a reference surface (the highest position in the wafer after polishing) and the central portion of a line part (a portion in which each wiring line was formed) on the wafer after polishing was measured, and an average value of the level differences in the entire wafer was classified according to the following categories.

The level difference is dishing, and it can be evaluated that the smaller the level difference (an average value of the level differences) is, the more excellent the dishing suppressing property is.

AAA: The level difference is less than 1 nm

AA: The level difference is 1 nm or more and less than 3 nm

A: The level difference is 3 nm or more and less than 5 nm

B: The level difference is 5 nm or more and less than 8 nm

C: The level difference is 8 nm or more and less than 10 nm

D: The level difference is 10 nm or more

<Evaluation of Scratch Suppressing Property>

The same wafer as used in <Evaluation of Dishing Suppressing Property> was polished under the conditions that a polishing pressure was set to 2.0 psi and a supply rate of the polishing liquid was set to 0.28 ml/(min·cm$^2$), using FREX300SII (polishing device). First, Co (bulk) of the non-wiring part was completely polished using CSL5250C as a polishing liquid, and then polishing was further performed for 10 seconds. Thereafter, the wafer in which the barrier layer covered the interlayer insulating film was polished using a polishing liquid shown in Table 3 for 1 minute under the same conditions to remove the barrier layer on the interlayer insulating film. The wafer after the polishing was cleaned with a cleaning liquid (pCMP liquid) (alkaline cleaning liquid: CL9010 (manufactured by Fujifilm Electronics Materials Co., Ltd.)) for 1 minute in a cleaning unit, further subjected to isopropanol (IPA) cleaning for 30 minutes, and then subjected to a drying treatment.

The obtained wafer was measured by a defect detection device, coordinates where defects having a major diameter of 0.06 μm or more were present were identified, and then the types of the defects at the identified coordinates were classified. The number of scratches (scratch-like defects) detected on the wafer was classified according to the following categories.

It can be evaluated that the smaller the number of the scratches is, the more excellent the scratch suppressing property is.

AA: The number of the scratches is 3 or less

A: The number of the scratches is 4 or 5

B: The number of the scratches is 6 to 10

C: The number of the scratches is 11 to 15

D: The number of the scratches is 16 or more

<Evaluation of Corrosion Suppressing Property>

A wafer was treated in the same manner as in <Evaluation of Scratch Suppressing Property>, except that the line-and-space of the wafer used was configured so that the line was 100 μm and the space was 100 μm.

The surface roughness (Ra) on the Co wiring line (wiring line with a width of 100 μm) exposed on a surface in the surface to be polished in the obtained wafer was measured with an atomic force microscope (AFM) at N=3, and average Ra's were classified according to the following categories.

It can be evaluated that the smaller Ra is, the more excellent the corrosion suppressing property is.

AAA: Ra of the measured area of 5 μm is less than 1.0 nm

AA: Ra of the measured area of 5 μm is 1.0 nm or more and less than 1.5 nm

A: Ra of the measured area of 5 μm is 1.5 or more and less than 2.0 nm

B: Ra of the measured area of 5 μm is 2.0 nm or more and less than 2.5 nm

C: Ra of the measured area of 5 μm is 2.5 nm or more and less than 3.0 nm

D: Ra of the measured area of 5 μm is 3.0 nm or more

<Evaluation of Polishing Speed (RR)>

A silicon wafer having a film consisting of Co on the surface was polished under the conditions that a polishing pressure was set to 2.0 psi and a supply rate of the polishing liquid was set to 0.28 ml/(min·$cm^2$), using FREX300SII (polishing device).

The film thickness before and after polishing was measured with a polishing time of 1 minute, a polishing speed RR (nm/min) was calculated from a difference in the film thickness, and the polishing speed with respect to Co was evaluated.

A: RR is 10 nm/min or more

B: RR is less than 10 nm/min

The tables below show the evaluation results of the tests performed using the polishing liquid of each of Examples or Comparative Examples.

TABLE 13

| | Evaluation | | | |
|---|---|---|---|---|
| Table 2-1 | RR | Dishing suppressing property | Corrosion suppressing property | Scratch suppressing property |
| Example 1 | A | A | B | A |
| Example 2 | A | A | A | A |
| Example 3 | A | A | A | A |
| Example 4 | A | A | A | A |
| Example 5 | A | A | A | A |
| Example 6 | A | A | A | A |
| Example 7 | A | A | A | A |
| Example 8 | A | A | A | A |
| Example 9 | A | A | A | A |
| Example 10 | A | A | B | A |
| Example 11 | A | A | A | A |
| Example 12 | A | A | A | AA |
| Example 13 | A | A | A | AA |
| Example 14 | A | A | A | AA |
| Example 15 | A | A | A | AA |
| Example 16 | A | A | A | AA |
| Example 17 | A | A | A | AA |
| Example 18 | A | A | A | AA |
| Example 19 | A | A | AA | AA |
| Example 20 | A | A | AA | AA |
| Example 21 | A | A | AA | AA |
| Example 22 | A | A | AA | AA |
| Example 23 | A | A | AA | AA |
| Example 24 | A | A | AA | AA |
| Example 25 | A | A | AA | AA |
| Example 26 | A | A | AA | AA |
| Example 27 | A | A | A | AA |
| Example 28 | A | A | AA | AA |
| Example 29 | A | A | AA | AA |
| Example 30 | A | A | AA | AA |

TABLE 14

| | Evaluation | | | |
|---|---|---|---|---|
| Table 2-2 | RR | Dishing suppressing property | Corrosion suppressing property | Scratch suppressing property |
| Example 31 | A | A | AA | AA |
| Example 32 | A | A | AA | AA |
| Example 33 | A | A | AA | AA |
| Example 34 | A | A | AA | AA |
| Example 35 | A | A | A | AA |
| Example 36 | A | A | AA | AA |
| Example 37 | A | A | AA | AA |
| Example 38 | A | A | AA | AA |
| Example 39 | A | A | AA | AA |
| Example 40 | A | A | AA | AA |
| Example 41 | A | A | AA | AA |
| Example 42 | A | A | AA | AA |
| Example 43 | A | AA | A | AA |
| Example 44 | A | AA | AA | AA |
| Example 45 | A | AA | AA | AA |
| Example 46 | A | AA | AA | AA |
| Example 47 | A | AA | AA | AA |
| Example 48 | A | AA | AA | AA |
| Example 49 | A | AA | AA | AA |
| Example 50 | A | AA | AA | AA |
| Example 51 | A | AAA | AA | AA |
| Example 52 | A | AAA | AAA | AA |
| Example 53 | A | AAA | AAA | AA |
| Example 54 | A | AAA | AAA | AA |
| Example 55 | A | AAA | AAA | AA |
| Example 56 | A | AAA | AAA | AA |
| Example 57 | A | AAA | AAA | AA |
| Example 58 | A | AAA | AAA | AA |
| Example 59 | A | AAA | AAA | AA |
| Example 60 | A | AAA | AAA | AA |

TABLE 15

| | Evaluation | | | |
|---|---|---|---|---|
| Table 2-3 | RR | Dishing suppressing property | Corrosion suppressing property | Scratch suppressing property |
| Example 61 | A | AAA | AAA | AA |
| Example 62 | A | A | AA | AA |
| Example 63 | A | AA | AA | A |
| Example 64 | A | AAA | AA | AA |
| Example 65 | A | AAA | AA | AA |
| Example 66 | A | AAA | AA | AA |
| Example 67 | A | AAA | AA | AA |
| Example 68 | A | AAA | AA | AA |
| Example 69 | A | AA | AA | AA |
| Example 70 | A | A | A | AA |
| Example 71 | A | A | AA | AA |
| Example 72 | A | A | AA | AA |
| Example 73 | A | A | AA | AA |
| Example 74 | A | A | AA | A |
| Example 75 | A | A | AA | AA |
| Example 76 | A | A | AA | AA |
| Example 77 | A | A | A | AA |
| Example 78 | A | A | AA | A |
| Example 79 | A | A | AA | AA |

TABLE 15-continued

| Table 2-3 | Evaluation RR | Dishing suppressing property | Corrosion suppressing property | Scratch suppressing property |
|---|---|---|---|---|
| Example 80 | A | A | AA | AA |
| Example 81 | A | AAA | A | AA |
| Example 82 | A | AAA | AA | AA |
| Example 83 | A | AAA | AA | AA |
| Example 84 | A | AAA | A | AA |
| Example 85 | A | AA | AA | AA |
| Example 86 | A | AA | AA | AA |
| Example 87 | A | A | A | AA |
| Example 88 | A | A | AA | AA |
| Example 89 | A | A | AA | AA |
| Example 90 | A | A | AA | AA |
| Example 91 | A | A | AA | A |
| Comparative Example 1 | A | AA | D | D |
| Comparative Example 2 | A | AA | D | A |
| Comparative Example 2 | A | A | AA | D |
| Comparative Example 3 | A | B | D | A |
| Comparative Example 4 | A | A | D | A |
| Comparative Example 5 | B | A | D | A |

From the results shown in the tables, it was confirmed that desired results could be obtained in a case of using the polishing liquid of the embodiment of the present invention.

Above all, it was confirmed that in a case where the zeta potential of colloidal silica as measured in the state where the colloidal silica are present in the polishing liquid is +20.0 mV or more, the effect of the present invention is more excellent (see the comparison of the results of Examples 1 to 11 and the other Examples, and the like).

It was confirmed that in a case where the C log P value of the passivation film forming agent in the present polishing liquid is 2.10 to 3.80, the effect of the present invention is more excellent (see the comparison of the results of Examples 1 to 11, and the like).

It was confirmed that in a case where the present polishing liquid includes a cationic compound, the effect of the present invention is more excellent (see the comparison of the results of Examples 3 and 12 to 18, and the like).

It was confirmed that in a case where the present polishing liquid includes a benzotriazole compound, the effect of the present invention is more excellent (see the comparison of the results of Examples 16, 21, 37, and 45, and the like).

It was confirmed that in a case where the present polishing liquid includes two or more kinds of benzotriazole compounds, the effect of the present invention is more excellent (see the comparison of the results of Examples 21, 37, and 45, and the like).

It was confirmed that in a case where the present polishing liquid includes an anionic surfactant, the effect of the present invention is more excellent (see the comparison of the results of Examples of 35 to 42, and 51 to 61, and the like).

It was confirmed that in a case where the present polishing liquid includes an organic acid, the effect of the present invention is more excellent (see the comparison of the results of Examples 37 and 64 to 69, and the like).

It was confirmed that in a case where the present polishing liquid includes an organic acid and a content thereof is 0.05% to 4.0% by mass with respect to the total mass of the polishing liquid, the effect of the present invention is more excellent (see the comparison of the results of Examples 64 to 69, and the like).

It was confirmed that in a case where a mass ratio (content of the passivation film forming agent/content of the polymer compound) of the content of the passivation film forming agent to the content of the polymer compound in the present polishing liquid is 0.05 or more and less than 10, the effect of the present invention is more excellent (see the comparison of the results of Examples 37 and 70 to 77, and the like).

It was confirmed that in a case where the present polishing liquid includes an organic solvent in an amount of 0.05% to 5% by mass with respect to the total mass of the polishing liquid, the effect of the present invention is more excellent (see the comparison of the results of Examples 37 and 78 to 80, and the like).

It was confirmed that in a case where the pH of the present polishing liquid was 2.5 to 3.8, the effect of the present invention is more excellent (see the comparison of the results of Examples 81 to 84, and the like).

It was confirmed that in a case where the present polishing liquid includes a nonionic surfactant, the effect of the present invention is more excellent (see the comparison of the results of Examples 37, 82, 85, and 86, and the like).

It was confirmed that in a case where the present polishing liquid includes a nonionic surfactant and an HLB value thereof is 8 to 15, the effect of the present invention is more excellent (see the comparison of the results of Examples 82, 85, and 86, and the like).

It was confirmed that in a case where the molecular weight of the polymer compound in the present polishing liquid was 2,000 to 30,000, the effect of the present invention is more excellent (see the comparison of the results of Examples 37 and 87 to 91, and the like).

Example B

Further, the following tests were performed while changing a polishing pressure (a contact pressure for contacting the surface to be polished and the polishing pad), using the polishing liquid of each of Examples 51, 52, 53, 54, 55, 56, 57, and 58 described above.

[Tests]

<Evaluation of Erosion Suppressing Property—1>

Wafer polishing was performed in the same manner as in <Evaluation of Dishing Suppressing Property>, except that the line-and-space of the wafer used in the test was configured to have a line of 9 μm and a space of 1 μm, and the polishing pressure was changed as shown in Table 3.

A level difference (height difference) between a reference surface (the highest position in the wafer after polishing) and a central portion of the space part (a portion in which a barrier layer or an interlayer insulating film was exposed) on the wafer after polishing was measured, and an average value of the level differences in the entire wafer was classified according to the following categories.

The level difference is erosion, and it can be evaluated that the smaller the level difference (an average value of the level differences) is, the more excellent the erosion suppressing property is.

AAA: The level difference is less than 5 nm

AA: The level difference is 5 nm or more and less than 8 nm

A: The level difference is 8 nm or more and less than 10 nm

B: The level difference is 10 nm or more and less than 12 nm

C: The level difference is 12 nm or more and less than 15 nm

D: The level difference is 15 nm or more

<Evaluation of Uniformity—1>

A polished wafer was obtained according to the method described in <Evaluation of Erosion Suppressing Property—1> described above.

For the wafer after polishing, a level difference of each of a chip formed in the vicinity of the center of the polished surface and a chip formed in the vicinity of the edge of the polished surface was measured, and a difference between the level difference measured in the vicinity of the center and the level difference in the vicinity of the edge was classified according to the following categories.

Furthermore, the level difference as mentioned herein is a total value of the erosion value (height difference between the reference surface and the central portion of the space part) and the dishing value (height difference between the reference surface and the central portion of the line part).

It can be evaluated that the smaller the difference between the level differences is, the more excellent the uniformity is.

AAA: The difference in the level difference is less than 3 nm

AA: The difference in the level difference is 3 nm or more and less than 5 nm

A: The difference in the level difference is 5 nm or more and less than 8 nm

B: The difference in the level difference is 8 nm or more and less than 10 nm

C: The difference in the level difference is 10 nm or more

The evaluation results of the tests performed while changing the contact pressure are shown below.

TABLE 16

| Table 3 | | Polishing pressure (psi) 0.25 | 0.5 | 1.0 | 2.0 | 3.0 | 3.5 |
|---|---|---|---|---|---|---|---|
| Example 51 | Erosion suppressing property | AA | AAA | AAA | AAA | AAA | B |
| | Uniformity | C | AA | AAA | AAA | AAA | B |
| Example 52 | Erosion suppressing property | AA | AAA | AAA | AAA | AAA | B |
| | Uniformity | C | AA | AAA | AAA | AAA | B |
| Example 53 | Erosion suppressing property | AA | AAA | AAA | AAA | AAA | B |
| | Uniformity | C | AA | AAA | AAA | AAA | B |
| Example 54 | Erosion suppressing property | AA | AAA | AAA | AAA | AAA | B |
| | Uniformity | C | AA | AAA | AAA | AAA | B |
| Example 55 | Erosion suppressing property | AA | AAA | AAA | AAA | AAA | B |
| | Uniformity | C | AA | AAA | AAA | AAA | B |
| Example 56 | Erosion suppressing property | AA | AAA | AAA | AAA | AAA | B |
| | Uniformity | C | AA | AAA | AAA | AAA | B |
| Example 57 | Erosion suppressing property | AA | AAA | AAA | AAA | AAA | B |
| | Uniformity | C | AA | AAA | AAA | AAA | B |
| Example 58 | Erosion suppressing property | AA | AAA | AAA | AAA | AAA | B |
| | Uniformity | C | AA | AAA | AAA | AAA | B |

As shown in the table, it was confirmed that the polishing pressure is preferably 0.5 to 3.0 psi, and more preferably 1.0 to 3.0 psi.

Example C

Further, the following tests were performed while changing the following supply rate of the polishing liquid (supply amount of polishing liquid supplied to the polishing pad during polishing), using the polishing liquid of each of Examples 51, 52, 53, 54, 55, 56, 57, and 58 described above.

[Tests]

<Evaluation of Residue Suppressing Property>

A wafer was treated in the same manner as in <Evaluation of Scratch Suppressing Property>, except that the supply rate of a polishing liquid was changed as shown in Table 4.

The obtained wafer was measured by a defect detection device, coordinates where defects having a major diameter of 0.06 μm or more were present were identified, and then the types of the defects at the identified coordinates were classified. The number of residues (residue-based defects) detected on the wafer was classified according to the following categories.

It can be evaluated that the smaller the number of the residues is, the more excellent the residue suppressing property is.

AAA: The number of the residues is less than 200

AA: The number of the residues is 200 or more and less than 350

A: The number of the residues is 350 or more and less than 500

B: The number of the residues is 500 or more and less than 750

C: The number of the residues is 750 or more and less than 1,000

D: The number of the residues is 1,000 or more

<Evaluation of Uniformity—2>

Evaluation of the uniformity was performed in the same manner as in <Evaluation of Uniformity—1>, except that the supply rate of the polishing liquid was changed as shown in Table 4 and the polishing pressure was fixed at 2.0 psi.

The evaluation results of the tests performed while changing the supply rate of the polishing liquid are shown below.

TABLE 17

| Table 4 | | Supply rate (ml/(min · $cm^2$)) of polishing liquid 0.10 | 0.14 | 0.21 | 0.28 | 0.35 | 0.40 |
|---|---|---|---|---|---|---|---|
| Example 51 | Residue suppressing property | C | AAA | AAA | AAA | AAA | AA |
| | Uniformity | B | AA | AAA | AAA | AAA | C |
| Example 52 | Residue suppressing property | C | AAA | AAA | AAA | AAA | AA |
| | Uniformity | B | AA | AAA | AAA | AAA | C |
| Example 53 | Residue suppressing property | C | AAA | AAA | AAA | AAA | AA |
| | Uniformity | B | AA | AAA | AAA | AAA | C |
| Example 54 | Residue suppressing property | C | AAA | AAA | AAA | AAA | AA |
| | Uniformity | B | AA | AAA | AAA | AAA | C |
| Example 55 | Residue suppressing property | C | AAA | AAA | AAA | AAA | AA |
| | Uniformity | B | AA | AAA | AAA | AAA | C |
| Example 56 | Residue suppressing property | C | AAA | AAA | AAA | AAA | AA |
| | Uniformity | B | AA | AAA | AAA | AAA | C |
| Example 57 | Residue suppressing property | C | AAA | AAA | AAA | AAA | AA |
| | Uniformity | B | AA | AAA | AAA | AAA | C |
| Example 58 | Residue suppressing property | C | AAA | AAA | AAA | AAA | AA |
| | Uniformity | B | AA | AAA | AAA | AAA | C |

As shown in the table, it was confirmed that the supply rate of the polishing liquid is preferably 0.14 to 0.35 ml/(min·$cm^2$), and more preferably 0.21 to 0.35 ml/(min·$cm^2$).

Example D

Further, the following tests were performed while changing the type of the cleaning liquid (pCMP liquid), using the polishing liquid of each of Examples 51, 52, 53, 54, 55, 56, 57, and 58 described above.

<Evaluation of Organic Residue Suppressing Property>

A wafer was treated in the same manner as in <Evaluation of Scratch Suppressing Property>, except that the type of the cleaning liquid to be used were changed as shown in Table 5.

The obtained wafer was measured by a defect detection device, coordinates where defects having a major diameter of 0.06 μm or more were present were identified, and then the types of the defects at the identified coordinates were classified. The number of organic residue sides (defects based on non-particulate organic residues) detected on the wafer was according to the following categories.

It can be evaluated that the smaller the number of the organic residues is, the more excellent the organic residue suppressing property is.

AAA: The number of the organic residues is less than 20

AA: The number of the organic residues is 20 or more and less than 35

A: The number of the organic residues is 35 or more and less than 50

B: The number of the organic residues is 50 or more and less than 75

C: The number of the organic residues is 75 or more and less than 100

D: The number of the organic residues is 100 or more.

<Evaluation of Particle Residue Suppressing Property>

Evaluation of the particle residue suppressing property was performed in light of the following categories in the same manner as in <Evaluation of Organic Residue Suppressing Property>, except that the type of defects to be detected (defects based on particulate residues) was changed to particle residues.

It can be evaluated that the smaller the number of the particle residues is, the more excellent the particle residue suppressing property is.

AAA: The number of the particle residues is less than 5

AA: The number of the particle residues is 5 or more and less than 10

A: The number of the particle residues is 10 or more and less than 20

B: The number of the particle residues is 20 or more and less than 40

C: The number of the particle residues is 40 or more and less than 60

D: The number of the particle residues is 60 or more

The evaluation results of the tests performed while changing the type of the cleaning liquid are shown below.

TABLE 18

| Table 5 | | Cleaning liquid DIW | Acidic | Alkaline |
|---|---|---|---|---|
| Example 51 | Organic Residue suppressing property | C | B | AAA |
| | Particle Residue suppressing property | AAA | C | AAA |
| Example 52 | Organic Residue suppressing property | C | B | AAA |
| | Particle Residue suppressing property | AAA | C | AAA |
| Example 53 | Organic Residue suppressing property | C | B | AAA |
| | Particle Residue suppressing property | AAA | C | AAA |
| Example 54 | Organic Residue suppressing property | C | B | AAA |
| | Particle Residue suppressing property | AAA | C | AAA |
| Example 55 | Organic Residue suppressing property | C | B | AAA |
| | Particle Residue suppressing property | AAA | C | AAA |
| Example 56 | Organic Residue suppressing property | C | B | AAA |
| | Particle Residue suppressing property | AAA | C | AAA |
| Example 57 | Organic Residue suppressing property | C | B | AAA |
| | Particle Residue suppressing property | AAA | C | AAA |
| Example 58 | Organic Residue suppressing property | C | B | AAA |
| | Particle Residue suppressing property | AAA | C | AAA |

DIW: Water

Acidic: CLEAN100 (manufactured by Fujifilm Electronics Materials Co., Ltd.: acidic cleaning liquid)

Alkaline: CL9010 (manufactured by Fujifilm Electronics Materials Co., Ltd.: alkaline cleaning liquid)

As shown in the table, it was confirmed that the alkaline cleaning liquid is preferable as the cleaning liquid.

Example E

Further, the following tests were performed while changing the type of the object to be polished, using the polishing liquid of each of Examples 51, 52, 53, 54, 55, 56, 57, and 58 described above.

<Evaluation of Polishing Speed (RR)>

A silicon wafer having a film consisting of Co, TiN, Ta, TaN, SiN, TEOS, SiOC, or SiC on the surface was polished under the conditions that a polishing pressure was set to 2.0 psi and a supply rate of the polishing liquid was set to 0.28 ml/(min·cm$^2$), using FREX300SII (polishing device).

The film thickness before and after polishing was measured by setting a polishing time to 1 minute, a polishing speed RR (nm/min) was calculated from a difference in the film thickness, and the polishing speed was evaluated with respect to each material according to the following categories.

(Case where Film is TiN, Ta, TaN, TEOS, or SiOC)

A: RR is 50 nm/min or more

B: RR is less than 50 nm/min (Case where Film is SiN or SiC)

A: RR is 20 nm/min or more

B: RR is less than 20 nm/min (Case where Film is Co)

A: RR is 10 nm/min or more

B: RR is less than 10 nm/min

The evaluation results are shown below.

Furthermore, a ratio of the polishing speed of Co to the polishing speed of TiN, Ta, TaN, SiN, TEOS, SiOC, or SiC (polishing speed of Co/polishing speed of TiN, Ta, TaN, SiN, TEOS, SiOC, or SiC) was in the range of more than 0.05 and less than 5.

TABLE 19

| | Object to be polished | | | | | | | |
|---|---|---|---|---|---|---|---|---|
| Table 6 | Co | TiN | Ta | TaN | SiN | TEOS | SiOC | SiC |
| Example 51 | A | A | A | A | A | A | A | A |
| Example 52 | A | A | A | A | A | A | A | A |
| Example 53 | A | A | A | A | A | A | A | A |
| Example 54 | A | A | A | A | A | A | A | A |
| Example 55 | A | A | A | A | A | A | A | A |
| Example 56 | A | A | A | A | A | A | A | A |
| Example 57 | A | A | A | A | A | A | A | A |
| Example 58 | A | A | A | A | A | A | A | A |

As shown in the results, it was confirmed that the polishing liquid of the embodiment of the present invention has no extreme speed difference between the polishing speed for Co and the polishing speed for TiN, Ta, TaN, SiN, TEOS, SiOC, or SiC, and is suitable as a polishing liquid used for removing a barrier layer and the like.

Furthermore, in the polishing liquid of the embodiment of the present invention, the polishing speed with respect to Co can be optionally adjusted (adjusted to, for example, between 0 and 30 nm/min) by adjusting the content of hydrogen peroxide in the polishing liquid.

EXPLANATION OF REFERENCES

10*a* object to be pretreated
10*b* object to be polished
10*c* object to be polished, which has been polished
12 cobalt-containing film
14 barrier layer
16 interlayer insulating layer
18 bulk layer

What is claimed is:

1. A polishing liquid used for chemical mechanical polishing of an object to be polished, the polishing liquid comprising:

colloidal silica, wherein an average primary particle diameter of the colloidal silica is 5 nm or more and 30 nm or less, and a content of the colloidal silica is in a range of 1.0% by mass or more and 5.5% by mass or less with respect to a total mass of the polishing liquid;

a cationic compound, wherein the cationic compound is a compound other than a surfactant, the cationic compound is a compound selected from the group consisting of tetrabutylammonium hydroxide (TBAH), tetrabutylphosphonium hydroxide (TBPH), and tetrapropylphosphonium hydroxide (TPPH), and a content of the cationic compound is 0.1% by mass or more and 5.0% by mass or less with respect to the total mass of the polishing liquid;

an anionic surfactant selected from the group consisting of N-lauroyl sarcosinate, dodecylbenzenesulfonic acid, and lauryl phosphonic acid, and a content of the anionic surfactant is in a range of 0.002% to 0.3% by mass with respect to the total mass of the polishing liquid;

at least one benzotriazole compound selected from the group consisting of benzotriazole, 5-methyl-1H-benzotriazole, and 1-hydroxybenzotriazole, and a content of the at least one benzotriazole compound is in a range of 0.01% to 0.5% by mass with respect to the total mass of the polishing liquid;

a passivation film forming agent having a C log P value of 1.5 to 3.8, and a content of the passivation film forming agent is in a range of 0.005% to 0.5% by mass with respect to the total mass of the polishing liquid, wherein the passivation film forming agent is one or more selected from the group consisting of 4-methylsalicylic acid, 4-methylbenzoic acid, 4-tert-butylbenzoic acid, 4-propylbenzoic acid, 6-hydroxy-2-naphthalenecarboxylic acid, 1-hydroxy-2-naphthalenecarboxylic acid, and 3-hydroxy-2-naphthalenecarboxylic acid;

a polymer compound; and hydrogen peroxide, wherein a pH is 2.0 to 4.0, a mass ratio of a content of the passivation film forming agent to a content of the polymer compound is 0.05 or more and less than 10, a mass ratio of the content of the passivation film forming agent to a content of the at least one benzotriazole compound is 0.01 to 4.0, a mass ratio of the content of the passivation film forming agent to a content of the cationic compound is 0.01 or more and 2.0 or less, and a mass ratio of the content of the polymer compound to the content of the cationic compound is 0.01 or more and less than 10.

2. The polishing liquid according to claim 1, wherein the at least one benzotriazole compound includes two or more benzotriazole compounds.

3. The polishing liquid according to claim 1, further comprising one or more organic acids selected from the group consisting of polycarboxylic acid and polyphosphonic acid.

4. The polishing liquid according to claim 3,
wherein the one or more organic acids are selected from the group consisting of citric acid, succinic acid, malic acid, maleic acid, 1-hydroxyethane-1,1-diphosphonic acid, and ethylenediaminetetramethylenephosphonic acid.

5. The polishing liquid according to claim 1,
wherein the polymer compound has a carboxylic acid group.

6. The polishing liquid according to claim 1,
wherein the polymer compound has a weight-average molecular weight of 2,000 to 30,000.

7. The polishing liquid according to claim 1, further comprising an organic solvent in an amount of 0.05% to 5.0% by mass with respect to the total mass of the polishing liquid.

8. The polishing liquid according to claim 1,
wherein the C log P value of the passivation film forming agent is 2.1 to 3.8.

9. The polishing liquid according to claim 1, further comprising a nonionic surfactant.

10. The polishing liquid according to claim 9,
wherein an HLB value of the nonionic surfactant is 8 to 15.

11. The polishing liquid according to claim 1,
wherein a concentration of solid contents is 10% by mass or more, and
the polishing liquid is used after 3-times or more dilution on a mass basis.

12. The polishing liquid according to claim 1, wherein a zeta potential of the colloidal silica in the polishing liquid is in a range of +20.0 mV to +40.0 mV.

13. A chemical mechanical polishing method comprising a step of obtaining an object to be polished, which has been polished, by bringing a surface to be polished of the object to be polished into contact with a polishing pad attached to a polishing platen while supplying the polishing liquid according to claim 1 to the polishing pad, and relatively moving the object to be polished and the polishing pad to polish the surface to be polished.

14. The chemical mechanical polishing method according to claim 13,
wherein the method is performed to form a wiring line consisting of a cobalt-containing film.

15. The chemical mechanical polishing method according to claim 14,
wherein the object to be polished has a second layer consisting of a material different from that of the cobalt-containing film, and
a ratio of a polishing speed of the cobalt-containing film to a polishing speed of the second layer is more than 0.05 and less than 5.

16. The chemical mechanical polishing method according to claim 15,
wherein the second layer includes one or more materials selected from the group consisting of Ta, TaN, TiN, SiN, tetraethoxysilane, SiC, and SiOC.

17. The chemical mechanical polishing method according to claim 13,
wherein a polishing pressure is 0.5 to 3.0 psi.

18. The chemical mechanical polishing method according to claim 13,
wherein a supply rate of the polishing liquid supplied to the polishing pad is 0.14 to 0.35 ml/(min·$cm^2$).

19. The chemical mechanical polishing method according to claim 13, further comprising a step of cleaning the object to be polished, which has been polished, with an alkaline cleaning liquid after the step of obtaining the object to be polished, which has been polished.

20. The chemical mechanical polishing method according to claim 13, further comprising a step of cleaning the object to be polished, which has been polished, with an organic solvent-based solution after the step of obtaining the object to be polished, which has been polished.

* * * * *